(12) United States Patent
Hsieh

(10) Patent No.: US 9,557,444 B2
(45) Date of Patent: Jan. 31, 2017

(54) ALKALI-SOLUBLE RESIN, PHOTOSENSITIVE RESIN COMPOSITION, COLOR FILTER, METHOD FOR MANUFACTURING THE SAME, AND LIQUID CRYSTAL DISPLAY APPARATUS

(71) Applicant: Chi Mei Corporation, Tainan (TW)

(72) Inventor: Bar-Yuan Hsieh, Taichung (TW)

(73) Assignee: Chi Mei Corporation, Tainan (TW)

( * ) Notice: Subject to any disclaimer, the term of this patent is extended or adjusted under 35 U.S.C. 154(b) by 310 days.

(21) Appl. No.: 14/464,718

(22) Filed: Aug. 21, 2014

(65) Prior Publication Data

US 2015/0060746 A1 Mar. 5, 2015

(30) Foreign Application Priority Data

Aug. 29, 2013 (TW) .............................. 102131071 A

(51) Int. Cl.
| | |
|---|---|
| *G02B 5/23* | (2006.01) |
| *G02B 1/04* | (2006.01) |
| *C08G 63/52* | (2006.01) |
| *G03F 7/027* | (2006.01) |
| *G02F 1/1335* | (2006.01) |
| *C08G 77/04* | (2006.01) |

(52) U.S. Cl.
CPC ................. *G02B 1/04* (2013.01); *C08G 63/52* (2013.01); *G02B 5/23* (2013.01); *G03F 7/027* (2013.01)

(58) Field of Classification Search
USPC .......... 252/582, 586; 349/106; 430/7, 281.1, 430/287.1; 528/26
See application file for complete search history.

(56) References Cited

FOREIGN PATENT DOCUMENTS

| | | |
|---|---|---|
| JP | 61-213213 | 9/1986 |
| JP | 01-152449 | 6/1989 |
| JP | 05-070528 | 3/1993 |
| JP | 05-078483 | 3/1993 |
| JP | 10-133372 | 5/1998 |

*Primary Examiner* — Bijan Ahvazi
(74) *Attorney, Agent, or Firm* — Jianq Chyun IP Office

(57) ABSTRACT

An alkali-soluble resin, a photosensitive resin composition, a color filter, and a method for manufacturing the same, and a liquid crystal display apparatus are provided. The photosensitive resin composition includes a specific alkali-soluble resin, a compound containing ethylenic unsaturated group, a photoinitiator, and an organic solvent. The photosensitive resin composition is excellent in developability and high precision pattern linearity and contour angle since the photosensitive resin composition contains a specific alkali-soluble resin.

19 Claims, 1 Drawing Sheet

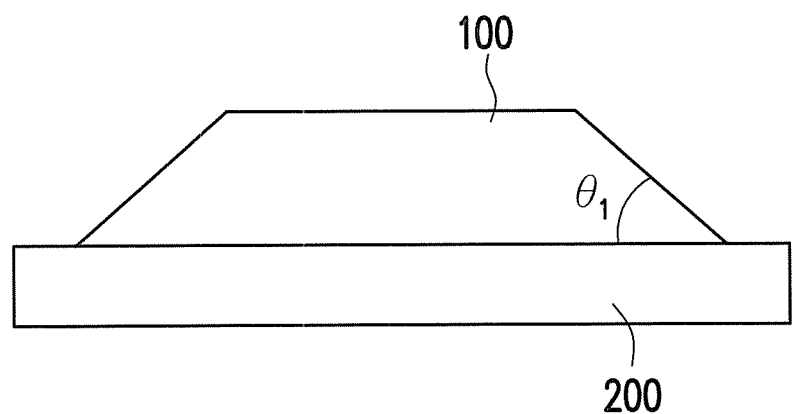

ALKALI-SOLUBLE RESIN, PHOTOSENSITIVE RESIN COMPOSITION, COLOR FILTER, METHOD FOR MANUFACTURING THE SAME, AND LIQUID CRYSTAL DISPLAY APPARATUS

CROSS-REFERENCE TO RELATED APPLICATION

This application claims the priority benefit of Taiwan application serial no. 102131071, filed on Aug. 29, 2013. The entirety of the above-mentioned patent application is hereby incorporated by reference herein and made a part of this specification.

BACKGROUND OF THE INVENTION

1. Field of the Invention

The invention relates an alkali-soluble resin for color filter, a photosensitive resin composition, and a color filter formed thereof which is used in a liquid crystal display. More particularly, the invention provides an alkali-soluble resin for color filter and a photosensitive resin composition thereof having good developability, high precision pattern linearity, and contour angle.

2. Description of Related Art

Due to having advantages of being light, thin, and low-power consuming, liquid crystal displays (LCDs) are applied in various products such as laptops, personal digital assistant devices, digital cameras, or desktops. However, such type of LCDs requires a color filter with high color reproduction range.

This color filter is obtained by forming hues of three colors, red (R), green (G), and blue (B) as stripe or mosaic patterns on a surface of a support such as a glass or a plastic sheet on which a black matrix (BM) is formed.

Up to date, several methods of manufacturing color filters have been proposed, and among them, the most well known method is a method for manufacturing the color filter through the usage of a negative-type photosensitive coloring composition. This negative-type photosensitive coloring composition consists of a dye, an acrylic resin, a photopolymerization initiator, and a reactive polymer. The negative-type photosensitive coloring composition is hardened by the following process. The photopolymerization initiator decomposed or activated by the ultraviolet irradiation starts polymerization because free radicals are formed. Thereafter, the ethylenic unsaturated group is activated by these free radicals to proceed radial polymerization. When using the negative-type photosensitive coloring composition to form the color filter, this negative-type photosensitive coloring composition is typically being coated on a substrate, irradiated by an ultraviolet light via a mask, and then developed to obtain a pattern. The pattern formed by the process mentioned above is heated to sticked on the substrate so as to form a pixel pattern. The cycle is repeated with the required colors to obtain a pattern of the colored coating. However, the repetition of the cycle will generate larger steps in the end of the BM and RGB pixels, and therefore the color displays unevenly resulting from the steps. In order to suppress the steps, a transparent resin layer (protective film) is introduced for the planarization of the color filter.

The protective film is required to have several traits, including the ability to protect the RGB colored layer, the thermal endurance for the liquid crystal filling process, and the hardness against the pressure force. A photosensitive curable resin composition with high cross linking density is developed to achieve the hardness mentioned above (with reference to Japanese Patent No. 5-78483). However, this photosensitive curable resin composition will go through contraction during the hardening process, and generates residual stress. This residual stress can easily cause defects in the high precision pattern linearity.

Although Japanese Patent No. 10-133372 mentioned that the defects in the high precision pattern linearity can be improved using a protective film composition containing epoxy compound, defects of poor developability and contour angle in high precision still exist.

Moreover, as the personal digital assistant devices and digital cameras become lighter and more compact in recent years, the color filters need to be lighter and thinner with higher color saturation as well. Therefore, it is crucial to increase the concentration of the coloring agent in the coloring composition. Nevertheless, as the concentration of the coloring agent is increased, the resin in photosensitive coloring composition will be relatively reduced. When the resin component on the pixel surface that contributes to the adhesion to the protective film is reduced, the adhesion between the pixel and the protective film is reduced, such that the protective film peels off from the interface with the pixel easily, and as a result, the high precision pattern linearity is poor.

In general, in the photosensitive resin composition of the aforementioned usage purpose, multi-functional photocurable monomers with polymerizable unsaturated bond, alkali-soluble resin, and a composition thereof with a photoinitiator are used. For example, Japanese Patent No. S61-213213 and Japanese Patent No. H1-152449 exemplify an application of the material for the color filter and disclose a copolymer of a (meth)acrylic acid or a (meth)acrylate with a carboxyl group, a maleic anhydride and other polymerizable monomers which is used as the alkali-soluble resin.

However, the copolymer disclosed here is a random copolymer and thus, generates a distribution of alkali dissolution rate inside a light-irradiated and a light-unirradiated parts, and as a result, it is difficult to obtain good developability or linearity in the high precision pattern during the development operation.

Although Japanese Patent No. H5-070528 refers to that a alkali-soluble photosensitive resin can be formed by reacting an epoxy acrylate compound having fluorene ring and an anhydride in molecules, and thereby, though the developability can be improved, the defects of poor contour angle in high precision still exist.

Therefore, how to improve the developability, high precision pattern linearity, and contour angle to meet the requirements of the industry is a goal of research in the technical field of the invention.

SUMMARY OF THE INVENTION

Accordingly, the invention provides an alkali-soluble resin and a photosensitive resin composition for a color filter of a liquid crystal display (LCD), which is capable of improving issues in insufficient developability, linearity of high precision patterns and contour angle of previous photosensitive resins.

The invention provides an alkali-soluble resin represented by the following formula (1):

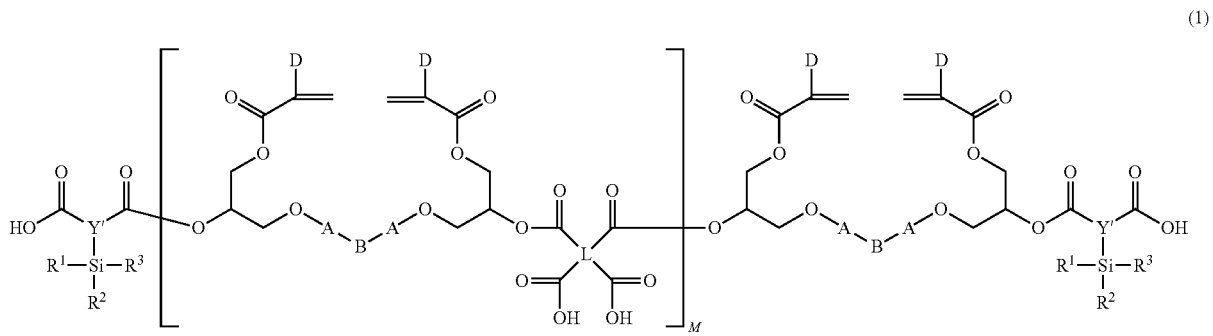

In formula (1), A represents a phenylene group, and a hydrogen atoms on the phenylene group may be substituted by a $C_1$-$C_5$ alkyl group, a halogen atom, or a phenyl group, B represents —CO—, —SO$_2$—, —C(CF$_3$)$_2$—, —Si(CH$_3$)$_2$—, —CH$_2$—, —C(CH$_3$)$_2$—, —O—, 9,9-fluorenylene, or a single bond, L represents a tetravalent carboxylic acid residue, Y' represents a $C_1$-$C_{20}$ trivalent organic group, each of $R^1$, $R^2$, and $R^3$ is independently a hydrogen atom, a halogen atom, or a monovalent organic group, D represents a hydrogen atom or a methyl group; and M is an integer ranging from 1 to 20.

In an embodiment of the invention, the alkali-soluble resin is obtained by reacting at least a component (a-1), a component (a-2), and a component (a-3). The component (a-1) is a diol compound with a polymerizable unsaturated group, the component (a-2) is a tetracarboxylic acid or a tetracarboxylic dianhydride, and the component (a-3) is a dicarboxylic acid anhydride represented by the following formula (2).

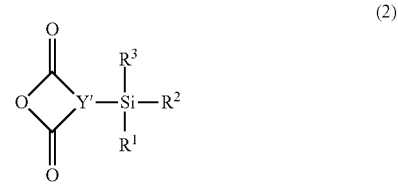

In formula (2), Y' represents a $C_1$-$C_{20}$ trivalent organic group, each of $R^1$, $R^2$, and $R^3$ is independently a hydrogen atom, a halogen atom, or a monovalent organic group.

In an embodiment of the invention, a mole ratio (a-2)/(a-1) of the component (a-2) to the component (a-1) is 0.2 to 1.0.

In an embodiment of the invention, a mole ratio (a-3)/(a-1) of the component (a-3) to the component (a-1) is 0.02 to 1.6.

The invention further provides a photosensitive resin composition which includes an alkali-soluble resin represented by the following formula (1), a compound containing ethylenic unsaturated group, a photoinitiator, and an organic solvent.

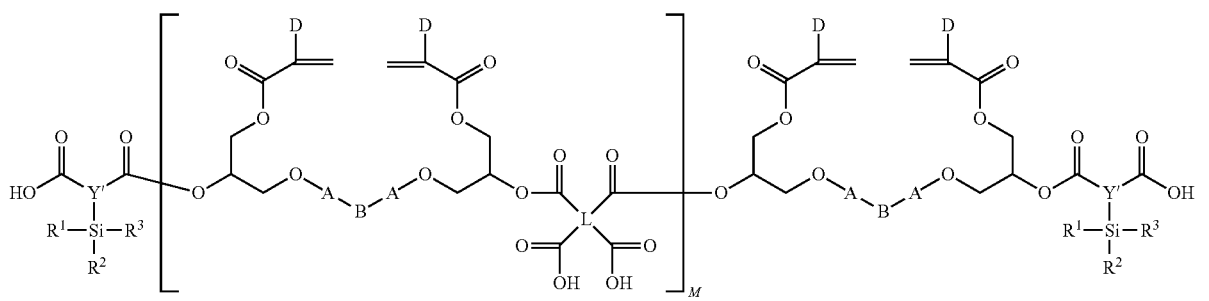

In formula (1), A represents a phenylene group, and a hydrogen atoms on the phenylene group may be substituted by a $C_1$-$C_5$ alkyl group, a halogen atom, or a phenyl group, B represents —CO—, —$SO_2$—, —$C(CF_3)_2$—, —$Si(CH_3)_2$—, —$CH_2$—, —$C(CH_3)_2$—, —O—, 9,9-fluorenylene, or a single bond, L represents a tetravalent carboxylic acid residue, Y' represents a $C_1$-$C_{20}$ trivalent organic group, each of $R^1$, $R^2$, and $R^3$ is independently a hydrogen atom, a halogen atom, or a monovalent organic group, D represents a hydrogen atom or a methyl group, and M is an integer ranging from 1 to 20.

In an embodiment of the invention, the alkali-soluble resin is obtained by reacting at least a component (a-1), a component (a-2), and a component (a-3). The component (a-1) is a diol compound with a polymerizable unsaturated group, the component (a-2) is a tetracarboxylic acid or a tetracarboxylic dianhydride, and the component (a-3) is a dicarboxylic acid anhydride represented by the following formula (2).

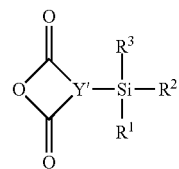

(2)

In formula (2), Y' represents a $C_1$-$C_{20}$ trivalent organic group, each of $R^1$, $R^2$, and $R^3$ is independently a hydrogen atom, a halogen atom, or a monovalent organic group.

In an embodiment of the invention, a mole ratio (a-2)/(a-1) of the component (a-2) to the component (a-1) is 0.2 to 1.0.

In an embodiment of the invention, a mole ratio (a-3)/(a-1) of the component (a-3) and the component (a-1) is 0.02 to 1.6.

In an embodiment of the invention, the compound containing ethylenic unsaturated group comprises at least one compound selected from the group consisting of compounds represented by formulas (8) and (9).

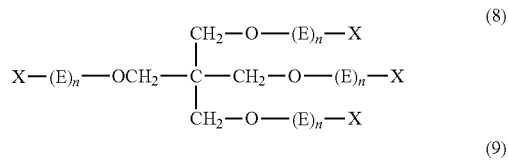

(8)

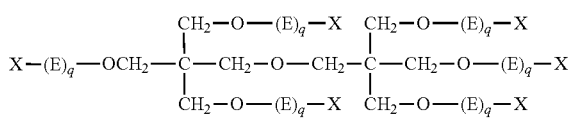

(9)

In formula (8) and formula (9), each of E independently represents —$((CH_2)_yCH_2O)$— or —$((CH_2)_yCH(CH_3)O)$—, each of y independently represents an integer ranging from 1 to 10, and each of X independently represents an acryloyl group, a methacryloyl group, a hydrogen atom, or a carboxyl group. In formula (8), a total number of the acryloyl group and the methacryloyl group represented by X is 3 or 4, and each of n independently represents an integer ranging from 0 to 10, and a sum of each n is an integer ranging from 1 to 40. In formula (9), a total number of the acryloyl group and the methacryloyl group represented by X is 5 or 6, and each of q independently represents an integer ranging from 0 to 10, and a sum of each q is an integer ranging from 1 to 60.

In an embodiment of the invention, the photosensitive resin composition further includes a secondary or tertiary aliphatic thiol compound.

In an embodiment of the invention, based on 100 parts by weight of the alkali-soluble resin, the usage amount of the compound containing ethylenic unsaturated group is 50 to 500 parts by weight, the usage amount of the photoinitiator is 10 to 150 parts by weight, and the usage amount of the organic solvent is 500 to 5000 parts by weight.

In an embodiment of the invention, the photosensitive resin composition further includes a coloring agent.

In an embodiment of the invention, the usage amount of the coloring agent is 20 to 200 parts by weight based on 100 parts by weight of alkali-soluble resin.

The invention also provides a method for manufacturing a color filter including the photosensitive resin composition used for forming a pixel layer.

The invention also provides a method for manufacturing a color filter including the photosensitive resin composition used for forming a protective film.

The invention further provides a color filter manufactured by the method mentioned above.

The invention further provides a liquid crystal display including the color filter mentioned above.

Accordingly, when the alkali-soluble resin of the invention is applied to a photosensitive resin composition, the issues in insufficient developability, linearity of high precision patterns and contour angle of the photosensitive resin composition can be solved. Thus, the photosensitive resin composition of the invention is suitable for the color filter and the liquid crystal display.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional view showing a photosensitive resin layer and a glass substrate.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The invention provides an alkali-soluble resin (A), which includes an alkali-soluble resin (A-1) represented by the following formula (1):

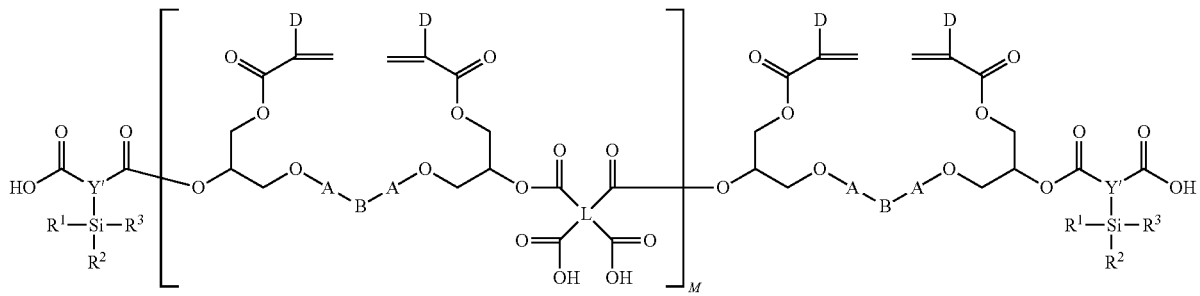

(1)

In formula (1), A represents a phenylene group, and a hydrogen atom on the phenylene group may be substituted by a $C_1$-$C_5$ alkyl group, a halogen atom, or a phenyl group; B represents —CO—, —SO$_2$—, —C(CF$_3$)$_2$—, —Si(CH$_3$)$_2$—, —CH$_2$—, —C(CH$_3$)$_2$—, —O—, 9,9-fluorenylene, or a single bond; L represents a tetravalent carboxylic acid residue; Y' represents a $C_1$-$C_{20}$ trivalent organic group; each of $R^1$, $R^2$, and $R^3$ is independently a hydrogen atom, a halogen atom, or a monovalent organic group; D represents a hydrogen atom or a methyl group, and M is an integer ranging from 1 to 20.

The alkali-soluble resin (A-1) of the invention is obtained by reacting at least a component (a-1), a component (a-2), and a component (a-3). The component (a-1) is a diol compound with a polymerizable unsaturated group, the component (a-2) is a tetracarboxylic acid or a tetracarboxylic dianhydride, and the component (a-3) is a dicarboxylic acid anhydride represented by the following formula (2).

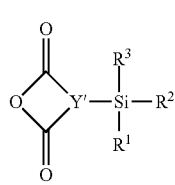

(2)

In formula (2), Y' represents a $C_1$-$C_{20}$ trivalent organic group, each of $R^1$, $R^2$, and $R^3$ is independently a hydrogen atom, a halogen atom, or a monovalent organic group.

The component (a-1) is manufactured by reacting a mixture, and the mixture contains a bisphenol compound (a-1-0 with two epoxy groups and a compound (a-1-ii) with at least one carboxylic acid group and at least one ethylenic unsaturated group. In addition, the mixture can also contain other compounds.

A bisphenol from the bisphenol compound (a-1-i) with two epoxy groups is preferably, for example, bis(4-hydroxyphenyl)ketone, bis(4-hydroxy-3,5-dimethylphenyl)ketone, bis(4-hydroxy-3,5-dichlorophenyl)ketone, bis(4-hydroxyphenyl)sulfone, bis(4-hydroxy-3,5-dimethylphenyl)sulfone, bis(4-hydroxy-3,5-dichlorophenyl)sulfone, bis(4-hydroxyphenyl)hexafluoropropane, bis(4-hydroxy-3,5-dimethylphenyl)hexafluoropropane, bis(4-hydroxy-3,5-dichlorophenyl)hexafluoropropane, bis(4-hydroxyphenyl)dimethylsilane, bis(4-hydroxy-3,5-dimethylphenyl)dimethylsilane, bis(4-hydroxy-3,5-dichlorophenyl)dimethylsilane, bis(4-hydroxyphenyl)methane, bis(4-hydroxy-3,5-dichlorophenyl)methane, bis(4-hydroxy-3,5-dibromophenyl)methane, 2,2-bis(4-hydroxyphenyl)propane, 2,2-bis(4-hydroxy-3,5-dimethylphenyl)propane, 2,2-bis(4-hydroxy-3,5-dichlorophenyl)propane, 2,2-bis(4-hydroxy-3-methylphenyl)propane, 2,2-bis(4-hydroxy-3-chlorophenyl)propane, bis(4-hydroxyphenyl)ether, bis(4-hydroxy-3,5-dimethylphenyl)ether, bis(4-hydroxy-3,5-dichlorophenyl)ether, 9,9-bis(4-hydroxyphenyl)fluorene, 9,9-bis(4-hydroxy-3,5-dimethylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3,5-dimethylphenyl)fluorene, and so on.

The bisphenol compound (a-1-i) with two epoxy groups can be obtained by, for example, reacting the aforementioned bisphenol compound with an epihalohydrin in the presence of an alkali metal hydroxide.

Preferred examples of the epihalohydrin include 3-chloro-1,2-epoxypropane, 3-bromo-1,2-epoxypropane, or any combination thereof. Before delivering the aforementioned dehydrohalogenation reaction, alkali metal hydroxide such as sodium hydroxide, potassium hydroxide, or the like may be added. The operating temperature of the dehydrohalogenation is 20° C. to 120° C., and the operating time of the dehydrohalogenation ranges from 1 to 10 hours.

In an embodiment, an aqueous solution of the alkali metal hydroxide may also be used as the alkali metal hydroxide added in the dehydrohalogenation reaction. In the present embodiment, while continuously adding the aqueous solution of the alkali metal hydroxide into the dehydrohalogenation reaction system, water and epihalohydrin may be continuously distilled out of the system at a reduced or a normal pressure. Thereby, water and epihalohydrin are separated and the water is removed, and the epihalohydrin is continuously reflowed to the reaction system at the same time.

Prior to the dehydrohalogenation reaction, a quaternary ammonium salt, such as tetramethyl ammonium chloride, tetramethyl ammonium bromide, trimethyl benzyl ammonium chloride, or the like may also be added as a catalyst and reacted at 50° C. to 150° C. for 1 to 5 hours. Then, the alkali metal hydroxide or the aqueous solution thereof is added and reacted at 20° C. to 120° C. for 1 to 10 hours for the dehydrohalogenation reaction.

Based on serving a total equivalent of the hydroxyl group in the bisphenol compound as 1 equivalent, the usage amount of the epihalohydrin is from 1 to 20 equivalent, and preferably from 2 to 10 equivalent weight. Based on serving a total equivalent of the hydroxyl group in the bisphenol compound as 1 equivalent, the usage amount of the alkali metal hydroxide is from 0.8 to 15 equivalent, and preferably from 0.9 to 11 equivalent.

Moreover, in order to conduct the dehydrohalogenation reaction more smoothly, not only an alcohol, such as methanol, ethanol or the like, but also an aprotic polar solvent, such as dimethyl sulfone, dimethyl sulfoxide, or the like, may also be added in the reaction. In a scenario where the alcohol is used, based on 100 wt % of epihalohydrin, the usage amount of the alcohol is from 2 wt % to 20 wt % and preferably from 4 wt % to 1.5 wt %. In an scenario where the aprotic polar solvent is used, based on 100 wt % of the epihalohydrin, the usage amount of the aprotic polar solvent is from 5 wt % to 100 wt % and preferably from 10 wt % to 90 wt %.

After the dehydrohalogenation reaction is completed, a washing treatment can be optionally conducted. Subsequently, the epihalohydrin, the alcohol, the aprotic polar solvent, etc. are removed by heating under reduced pressure. For example, the temperature may range from 110° C. to 250° C. while the pressure may be 1.3 kPa (10 mmHg) or less.

to 0.9 mole. Additionally, the range of the operating temperature of the dehydrohalogenation reaction is 50° C. to 120° C., and the range of the operating time of the dehydrohalogenation reaction is 0.5 to 2 hours.

After the dehydrohalogenation reaction is completed, the salt may be removed by steps, such as filtrating or rinsing, etc. Furthermore, the solvent, such as benzene, toluene, methyl isobutyl ketone, etc. may be distilled off by being heated under reduced pressure to obtain the bisphenol compound (a-1-i) with two epoxy groups.

The bisphenol compound (a-1-i) with two epoxy groups is preferably a bisphenol compound having two epoxy groups represented by formula (3-1) as follows or a polymer polymerized by taking bisphenol compound with two epoxy groups as monomer represented by following formula (3-2).

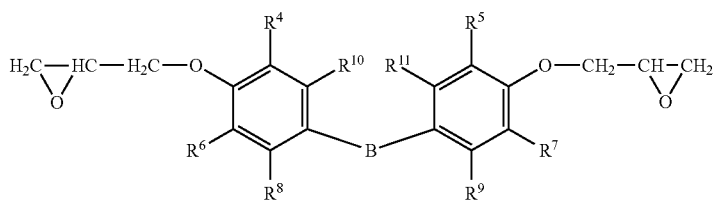

(3-1)

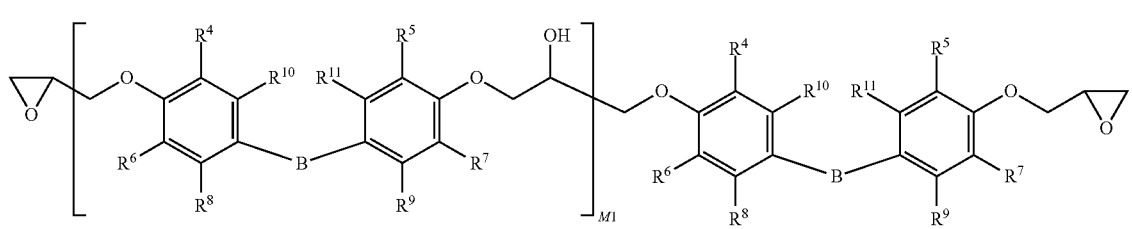

(3-2)

In order to prevent the formed epoxy resin from containing hydrolysable halogen, the solution after the dehydrohalogenation reaction may be added to a solvent such as benzene, toluene, methyl isobutyl ketone, etc. Then, an aqueous solution of alkali metal hydroxide such as sodium hydroxide, potassium hydroxide, etc. is added, and the dehydrohalogenation reaction is performed again. In the dehydrohalogenation reaction, based on serving a total equivalent of the hydroxyl group in the bisphenol compound as 1 equivalent, the usage amount of the alkali metal hydroxide is 0.01 mole to 1 mole, and preferably 0.05 mole In formulas (3-1) and (3-2), each of $R^4$, $R^5$, $R^6$, $R^7$, $R^8$, $R^9$, $R^{10}$, and $R^{11}$ is independently a hydrogen atom, a halogen atom, a $C_1$-$C_5$ alkyl group or a phenyl group. B represents —CO—, —SO$_2$—, —Si(CH$_3$)$_2$—, —CH$_2$—, —C(CH$_3$)$_2$—, —O—, 9,9-fluorenylene, or a single bond. M1 is an integer ranging from 1 to 10, preferably 1 to 2.

The bisphenol compound having two epoxy groups represented by formula (3-1) is optimally a bisphenol compound having two epoxy groups represented by formula (4) as follows.

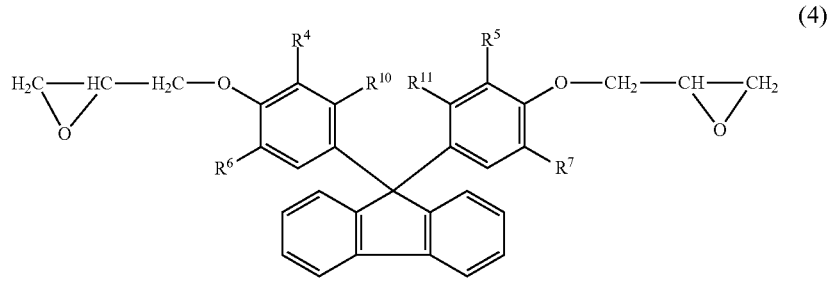

(4)

In formula (4), each of $R^4$, $R^6$, $R^7$, $R^{10}$, and $R^{11}$ is independently a hydrogen atom, a halogen atom, a $C_1$-$C_5$ alkyl group, or a phenyl group.

The bisphenol compound with two epoxy groups represented by formula (4) is, for example, a bisphenol fluorene compound with two epoxy groups obtained by reacting bisphenol fluorene compound and epihalohydrin.

The bisphenol fluorene compound may be a compound, such as 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, etc.

The epihalohydrin is, for example, 3-chloro-1,2-epoxypropane (epichlorohydrin), 3-bromo-1,2-epoxypropane (epibromohydrin), or the like.

The bisphenol fluorene compound with two epoxy groups includes products that are available in the market, which are (1) products made by Nippon Steel Chemical, such as ESF-300 and so on, (2) products made by Osaka Gas, such as PG-100, EG-210 and so on, and (3) products made by S.M.S Technology Co, such as SMS-F9PhPG, SMS-F9CrG, SMS-F914PG and so on.

The compound (a-1-ii) having at least one carboxylic acid group and at least one ethylenic unsaturated group is at least one compound selected from the group consisting of the following compounds: acrylic acid, methacrylic acid, 2-methacryloyloxyethylbutanedioic acid, 2-methacryloyloxybutylbutanedioic acid, 2-methacryloyloxyethylhexanedioic acid, 2-methacryloyloxybutylhexanedioic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropylhexanedioic acid, 2-methacryloyloxypropyltetrahydrophthalic acid, 2-methacryloyloxypropylphthalic acid, 2-methacryloyloxybutylphtlialic acid, or 2-methacryloyloxybutylhydrophthalic acid; a compound obtained by reacting hydroxyl-containing (meth)acrylate and dicarboxylic acid, wherein the dicarboxylic acid includes, but not limit to, adipic acid, succinic acid, maleic acid, and phthalic acid; a hemiester compound obtained by reacting hydroxyl-containing (meth)acrylate and carboxylic acid anhydride compound, wherein the hydroxyl-containing (meth)acrylate includes, but not limit to, (2-hydroxyethyl) acrylate, (2-hydroxyethyl)methacrylate, (2-hydroxypropyl) acrylate, (2-hydroxypropyl)methacrylate, (4-hydroxybutyl) acrylate, (4-hydroxybutyl)methacrylate, pentaerythritol trimethacrylate or the like. Additionally, the carboxylic acid anhydride compound may be at least one compound selected from the group consisting of the following compounds: dicarboxylic acid anhydride compounds, e.g., butanedioic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydrophthalic anhydride, chlorendic anhydride, glutaric anhydride, trimellitic acid anhydride, and 1,3-dioxoisobenzofuran-5-carboxylic anhydride; and tetracarboxylic acid anhydride compounds, e.g., benzophenone tetracarboxylic dianhydride (BTDA), biphenyl tetracarboxylic dianhydride, diphenylether tetracarboxylic dianhydride, and the like.

The component (a-2) is at least one compound selected from the group consisting of saturated straight chain hydrocarbon tetracarboxylic acid, alicyclic tetracarboxylic acid, aromatic tetracarboxylic acid, and the dianhydrides thereof.

Examples of the saturated straight chain hydrocarbon tetracarboxylic acid include butanetetracarboxylic acid, pentanetetracarboxylic acid, and hexanetetracarboxylic acid. The saturated straight chain hydrocarbon tetracarboxylic acid may also have a substituent.

Examples of the alicyclic tetracarboxylic acid include cyclobutanetetracarboxylic acid, cyclopentanetetracarboxylic acid, cyclohexanetetracarboxylic acid, and norbornane tetracarboxylic acid. The alicyclic tetracarboxylic acid may also have a substituent.

Examples for the aromatic tetracarboxylic acid include pyromellitic acid, benzophenone tetracarboxylic acid, biphenyltetracarboxylic acid, diphenylethertetracarboxylic acid, diphenylsulfonetetracarboxylic acid, and 1,2,3,6-tetrahydrophthalic acid.

In the invention, the component (a-2) is preferably biphenyltetracarboxylic acid, benzophenone tetracarboxylic acid, diphenylethertetracarboxylic acid, or the dianhydride thereof, and more preferably biphenyltetracarboxylic acid, diphenylethertetracarboxylic acid, or the dianhydride thereof.

In a scenario where the alkali-soluble resin (A-1) of the invention is used as a photosensitive composition, a good developability of the photosensitive resin composition can be achieved when a mole ratio (a-2)/(a-1) of the component (a-2) to the component (a-1) is 0.2 to 1.0, a better developability of the photosensitive resin composition can be achieved when the mole ratio (a-2)/(a-1) of the component (a-2) to the component (a-1) is 0.3 to 1.0, and an even better developability of the photosensitive resin composition can be achieved when the mole ratio (a-2)/(a-1) of the component (a-2) to the component (a-1) is 0.4 to 1.0.

The component (a-3) is the dicarboxylic acid anhydride represented by the following formula (2).

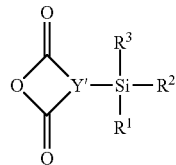

(2)

In formula (2), Y' represents a $C_1$-$C_{20}$ trivalent organic group, each of $R^1$, $R^2$, and $R^3$ is independently a hydrogen atom, a halogen atom, or a monovalent organic group.

The component (a-3) is at least one compound selected from the group consisting of trimethoxysilylpropyl succinic anhydride, triethoxysilylpropyl succinic anhydride, methyldimethoxysilylpropyl succinic anhydride, methyldiethoxysilylpropyl succinic anhydride, trimethoxysilylbutyl succinic anhydride, triethoxysilylbutyl succinic anhydride, methyldiethoxysilylbutyl succinic anhydride, para-(trimethoxysilyl)phenyl succinic anhydride, para-(triethoxysilyl)phenyl succinic anhydride, para-(methyldimethoxysilyl)phenyl succinic anhydride, para-(methyldiethoxysilyl)phenyl succinic anhydride, meta-(trimethoxysilyl)phenyl succinic anhydride, meta-(triethoxysilyl)phenyl succinic anhydride, and meta-(methyldiethoxysilyl)phenyl succinic anhydride.

The component (a-3) is preferably at least one compound selected from the group consisting of trimethoxysilylpropyl succinic anhydride, triethoxysilylpropyl succinic anhydride, para-(trimethoxysilyl)phenyl succinic anhydride, para-(triethoxysilyl)phenyl succinic anhydride, meta-(trimethoxysilyl)phenyl succinic anhydride, and meta-(triethoxysilyl)phenyl succinic anhydride.

In a scenario where the alkali-soluble resin (A-1) of the invention is used as a component of the photosensitive composition described hereinafter, good linearity of high precision patterns of the photosensitive composition can be achieved when a mole ratio (a-3)/(a-1) of the component (a-3) to component (a-1) is 0.02 to 1.6, better linearity of high precision patterns of the photosensitive composition can be achieved when the mole ratio (a-3)/(a-1) of the component (a-3) to component (a-1) is 0.1 to 1.5, and even better linearity of high precision patterns of the photosensitive composition can be achieved when the mole ratio (a-3)/(a-1) of the component (a-3) to component (a-1) is 0.2 to 1.4.

If the alkali-soluble resin does not contain the component (a-3), the obtained patterns will have bad contour angle when the alkali-soluble resin is used as a component of a photosensitive composition.

In addition to the component (a-1), the component (a-2), and the component (a-3), the alkali-soluble resin of the invention may also include a composition (a-4).

The composition (a-4) includes dicarboxylic acid and anhydride thereof, but does not include the component (3). Examples of the dicarboxylic acid include saturated straight chain hydrocarbon dicarboxylic acid, saturated cyclic hydrocarbon dicarboxylic acid, and unsaturated dicarboxylic acid.

Examples of the saturated straight chain hydrocarbon dicarboxylic acid include succinic acid, acetyl succinic acid, adipic acid, azelaic acid, citramalic acid, malonic acid, glutaric acid, citric acid, tartaric acid, oxoglutaric acid, pimelic acid, sebacic acid, suberic acid, and diglycolic acid. The hydrocarbon group in the saturated straight chain hydrocarbon dicarboxylic acid may also be substituted.

Examples of the saturated cyclic hydrocarbon dicarboxylic acid include hexahydrophthalic acid, cyclobutanedicarboxylic acid, cyclopentanedicarboxylic acid, norbornanedicarboxylic acid, and hexahydrotrimellitic acid. The saturated cyclic hydrocarbon dicarboxylic acid may also be an alicyclic dicarboxylic acid in which saturated hydrocarbon is substituted.

Examples of the unsaturated dicarboxylic acid include maleic acid, itaconic acid, phthalic acid, tetrahydrophthalic acid, methyl endo-methylene tetrahydrophthalic acid, chlorendic acid, and trimellitic acid.

The dicarboxylic acid is preferably succinic acid, itaconic acid, tetrahydrophthalic acid, hexahydrotrimellitic acid, phthalic acid, and trimellitic acid, and more preferably succinic acid, itaconic acid, and tetrahydrophthalic acid.

The component (a-4) is preferably succinic acid anhydride, itaconic acid anhydride, tetrahydrophthalic acid anhydride, hexahydrotrimellitic acid anhydride, phthalic acid anhydride, and trimellitic acid anhydride, and more preferably succinic acid anhydride, itaconic acid anhydride, and tetrahydrophthalic acid anhydride.

The invention is not intent to limit the method of manufacturing the alkali-soluble resin (A-1), and the alkali soluble resin can be obtained by reacting the component (a-1), the component (a-2), and the component (a-3). For example, the alkali-soluble resin of the invention may be obtained by heating the bisphenol fluorene epoxy(meth)acrylate served as the component (a-1) in a solvent, such as propylene glycol monomethyl ether acetate or the like, and reacting the resultant with the components (a-2) and (a-3).

Moreover, the invention is also not intent to limit the reaction condition of the solvent and the catalyst used for manufacturing the alkali-soluble resin, but it is preferred to choose a solvent with no hydroxyl group and having a boiling point higher than the reaction temperature. Examples of such type of solvent may include: cellosolve solvents such as ethyl cellosolve acetate, butyl cellosolve acetate, etc.; ether or ester solvents with high boiling points such as diglyme, ethylcarbitol acetate, butylcarbitol acetate, propylene glycol monomethyl ether acetate, etc.; and ketone solvents such as cyclohexanone, diisobutyl ketone, etc. In addition, examples of the catalyst may be ammonium salts such as tetraethylammonium bromide, triethylbenzylammonium chloride, etc. and phosphine compounds such as triphenylphosphine, tris(2,6-dimethoxyphenyl)phosphine, etc., which are commonly known in the art.

Furthermore, the invention is not intent to limit the method of reacting the components (a-1), (a-2), (a-3) and/or (a-4). For example, a commonly known method of reacting diol compound and tetracarboxylic dianhydride at a temperature of 90° C. to 140° C. as described in Japanese Patent Application Publication No. H9-325494 may be utilized. Preferably, the components are reacted in a manner that ends of the compound is a carboxyl group and are quantitatively reacted in a manner that a mole ratio of the component (a-1), the component (a-2), the component (a-3), and the component (a-4) ((a-1):(a-2):(a-3):(a-4)) is 1:0.2-1:0.02-1.6:0-0.3. Additionally, the components are preferably to be homogeneously dissolved and reacted at the temperature of 90° C. to 130° C. and thereafter reacted and aged at the reaction temperature of 40° C. to 80° C.

A number average molecular weight of the alkali-soluble resin represented by formula (1) that is measured by a gel permeation chromatography (GPC) and converted using polystyrene is preferably more than or equal to 1,000 and less than or equal to 10,000. When having the number average molecular weight less than 1,000, the alkali-soluble resin represented by formula (1) may result in having risk of alkali resistance degradation, causing gaps to the patterns due to alkali development after a photocurable process, and significant reduction in reproducibility of fine line patterns. When the number average molecular weight is greater than 10,000, poor developability after a lithography process will occur easily.

The photosensitive resin composition of the invention includes an alkali-soluble resin (A), a compound containing ethylenic unsaturated group (B), a photoinitiator (C), and an organic solvent (D), but the invention is not limited thereto, and the photosensitive resin composition of the invention may also include a secondary or tertiary aliphatic thiol compound (E), a coloring agent (F), and an additive (G).

The alkali-soluble resin (A) includes the alkali-soluble resin (A-1) represented by the following formula (1), and may also include other alkali-soluble resins (A-2), if needed.

Descriptions regarding the alkali-soluble resin (A-1) have been discussed thoroughly above and will not be repeated hereinafter.

The alkali-soluble resin (A-2) includes a derived unit having a structure represented by formula (5):

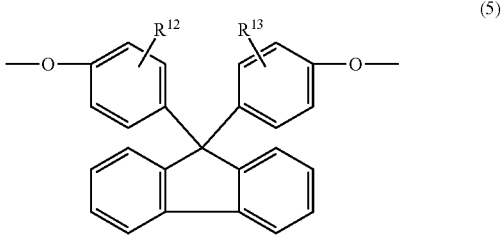

(5)

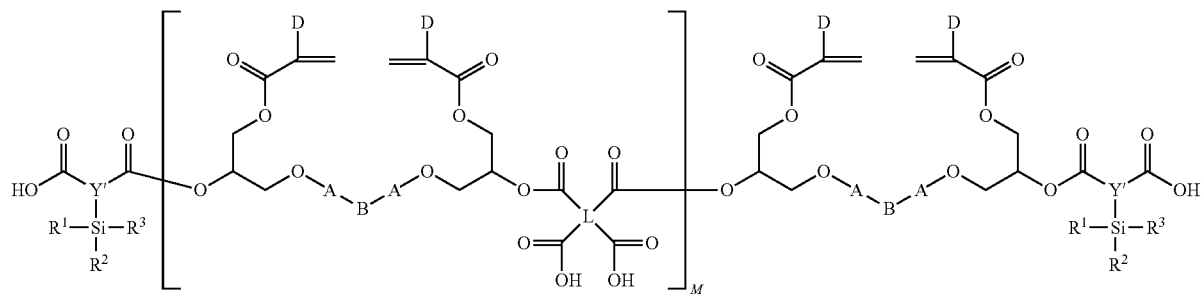

(1)

In formula (1), A represents a phenylene group, and a hydrogen atoms on the phenylene group may be substituted by a $C_1$-$C_5$ alkyl group, a halogen atom, or a phenyl group; B represents —CO—, —SO$_2$—, —C(CF$_3$)$_2$—, —Si(CH$_3$)$_2$—, —CH$_2$—, —C(CH$_3$)$_2$—, —O—, 9,9-fluorenylene, or a single bond; L represents a tetravalent carboxylic acid residue; Y' represents a $C_1$-$C_{20}$ trivalent organic group; each of $R^1$, $R^2$, and $R^3$ is independently a hydrogen atom, a halogen atom, or a monovalent organic group; D represents a hydrogen atom or a methyl group; and M is an integer ranging from 1 to 20.

In formula (5), each of $R^{12}$ and $R^{13}$ is independently hydrogen atom, a straight chain or branched chain $C_1$-$C_5$ alkyl group, a phenyl group, and a halogen atom.

The alkali-soluble resin (A-2) is obtained by reacting the compound having the structure represented by formula (5) and another copolymerizable compound.

The compound having structure represented by formula (5) may be a bisphenol fluorene compound with two epoxy groups which is represented by the following formula (6) or a bisphenol fluorene compound with two hydroxyl groups which is represented by the following formula (7).

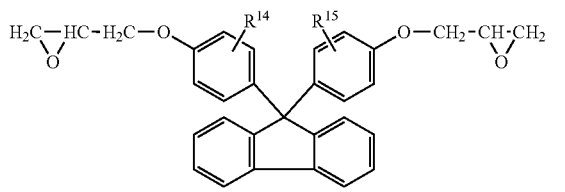

(6)

In formula (6), $R^{14}$ is the same as $R^{12}$ of formula (5), and $R^{15}$ is the same as $R^{13}$ of formula (5).

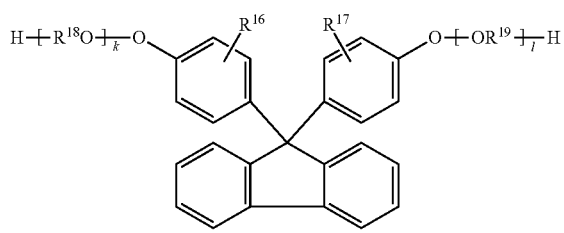

(7)

In formula (7), $R^{16}$ is the same as $R^{12}$ in formula (5), $R^{17}$ is the same as $R^{13}$ in formula (5), $R^{18}$ and $R^{19}$ are independently $C_1$-$C_{20}$ alkylene groups or alicyclic groups, k and l are independently integers ranging from 1 to 4.

Other copolymerizable compound may include: unsaturated monocarboxylic acids such as acrylic acid, methacrylic acid, crotonic acid, α-chloroacrylic acid, ethylacrylic acid, and cinnamic acid; dicarboxylic acids such as maleic acid, itaconic acid, succinic acid, phthalic acid, tetrahydrophthalic acid, hexahydrophthalic acid, methyl tetrahydrophthalic acid, methyl hexahydrophthalic acid, methyl endo-methylene tetrahydro phthalic acid, chlorendic acid, glutaric acid, etc. and anhydrides thereof; tricarboxylic acid such as trimellitic acid and anhydride thereof; and tetracarboxylic acids such as pyromellitic acid, benzophenone tetracarboxylic acid, biphenyl tetracarboxylic acid, biphenylether tetracarboxylic acid, etc. and anhydrides thereof.

The alkali-soluble resin (A-2) is preferred to be a product made by Nippon Steel Chemical, for example, V259ME, V301ME (all product names) and so on.

The photosensitive resin composition of the invention may form patterns with a good contour angle by containing the alkali-soluble resin (A-1). During the synthesizing process of the alkali-soluble resin (A-1) contained in the photosensitive resin composition, a good developability can be achieved when a mole ratio (a-2)/(a-1) of the component (a-2) to the component (a-1) is 0.2 to 1.0, a better developability can be achieved when the mole ratio (a-2)/(a-1) is 0.3 to 1.0, and an even better developability can be achieved when the mole ratio (a-2)/(a-1) is between 0.4 to 1.0. In addition, during the synthesizing process the alkali-soluble resin (A-1) contained in the photosensitive resin composition, good linearity of high precision pattern can be achieved when a mole ratio (a-3)/(a-1) of the component (a-3) to the component (a-1) is 0.02 to 1.6, better linearity of the high precision pattern can be achieved when the mole ratio (a-3)/(a-1) is 0.1 to 1.5 and even better linearity of the high precision pattern can be achieved when the mole ratio (a-3)/(a-1) is 0.2 to 1.4.

The compound containing ethylenic unsaturated group (B) contained in the photosensitive resin composition of the invention includes a compound (B-1) which is at least one compound selected from the group consisting of compounds represented by formulas (8) and (9) or other compound containing ethylenic unsaturated group (B-2).

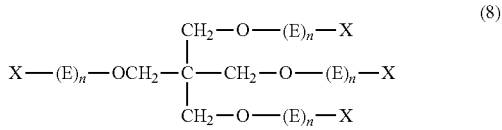

(8)

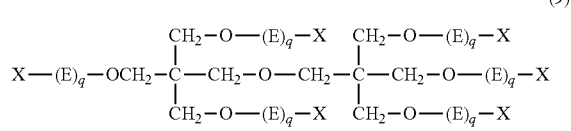

(9)

In formula (8) and formula (9), each of E independently represents —$((CH_2)_yCH_2O)$— or —$((CH_2)_yCH(CH_3)O)$—, each of y independently represents an integer ranging from 1 to 10, and each of X independently represents an acryloyl group, a methacryloyl group, a hydrogen atom, or a carboxyl group. In formula (8), a total number of the acryloyl groups and the methacryloyl groups represented by X is 3 or 4, and each of n independently represents an integer ranging from 0 to 10, and a sum of each n is an integer ranging from 1 to 40. In formula (9), a total number of the acryloyl groups and the methacryloyl groups represented by X is 5 or 6, and each of q independently represents an integer ranging from 0 to 10, and a sum of each q is an integer ranging from 1 to 60.

The compounds represented by formulas (8) or (9) may be synthesized by a commonly known process, and the process includes a step of bonding pentaerythritol or dipentaerythritol to a ring-opened skeleton by ring-opening addition reaction of ethylene oxide or propylene oxide and a step of introducing a (meth)acryloyl group by reacting, for example, a (meth)acryloyl chloride and the hydroxyl group at the end of the ring-opened skeleton. Each step is commonly known, and the compound represented by formulas (8) or (9) can be easily synthesized by persons having ordinary skills in the art.

Among the compounds represented by formulas (8) and (9), pentaerythritol derivatives and/or dipentaerythritol derivatives are preferred.

Specific examples of the compound represented by formula (8) include compounds represented by formula (10) to formula (13), wherein compounds represented by formula (10) and formula (11) are preferred, a sum of each n in formulas (10) and (13) are 6, and a sum of each n in formulas (11) and (12) is 12. There are also commercially available products such as KAYARAD DPEA-12 made by Nippon Kayaku Co., Ltd.

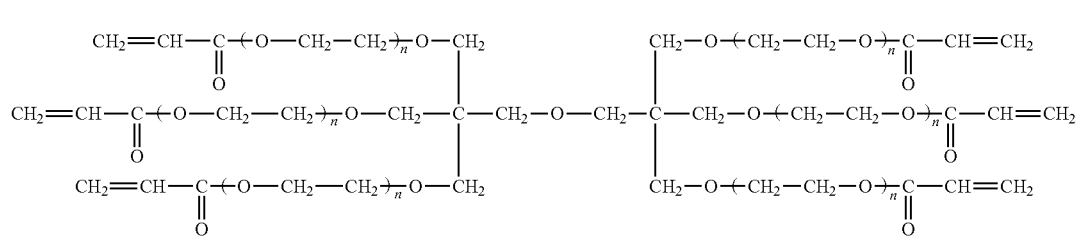

(10)

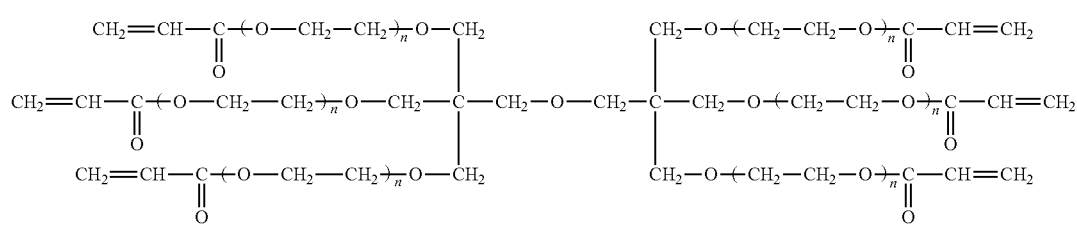

(11)

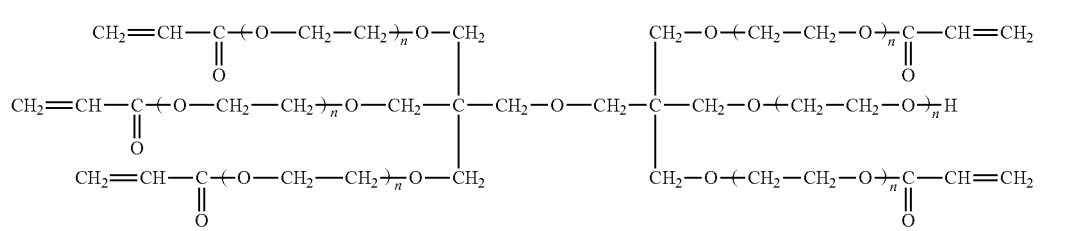

(12)

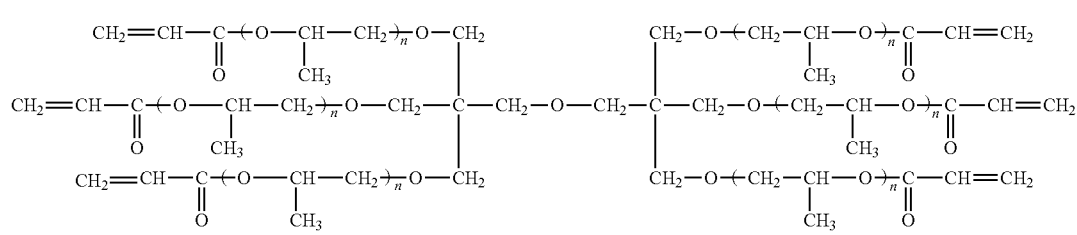

(13)

Specific examples of the compound represented by formula (9) include compounds represented by formula (14) and formula (15), ethoxylated pentaerythritol tetraacrylate, and propoxylated pentaerythritol tetraacrylate. A sum of each m in formula (14) is 4, and a sum of each m in formula (15) is 12. There are also commercially available products such as EM2411 and EM2421 (made by Eternal Chemical Co., Ltd.), Miramer M4004 (made by Nippon Toyo Chemical Co., Ltd.).

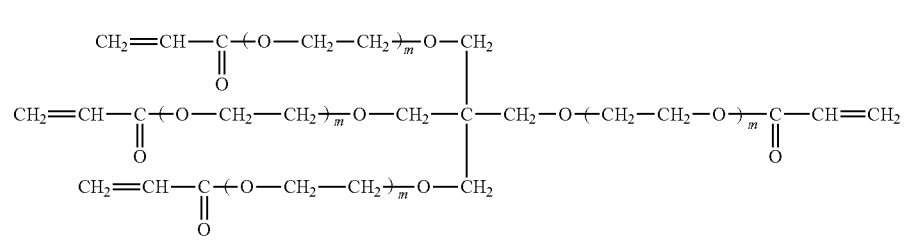

(14)

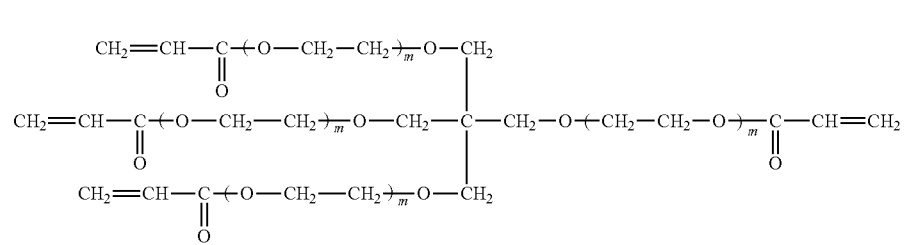

(15)

Other compound containing an ethylenic unsaturated group (B-2) include a compound selected from the group consisting of (meth)acrylate compound (B-2-i) obtained by reacting caprolactone-modified polyalcohol and (meth) acrylic acid and a compound (B-2-ii) having the functional group represented by formula (16).

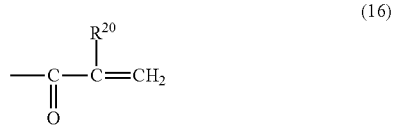

In formula (16), $R^{20}$ represents a hydrogen or a methyl group.

The aforementioned caprolactone-modified polyalcohol is manufactured by reacting caprolactone and polyalcohol with four or more functional groups, wherein the caprolactone may be γ-caprolactone, δ-caprolactone, or ε-caprolactone, and is preferred to be ε-caprolactone. The polyalcohol with four or more functional groups may be pentaerythritol, di(trimethylolpropane), dipentaerythritol, or the like.

Specific examples of the (meth)acrylate compound (B-2-i) may include a pentaerythritol caprolactone-modified tetra(meth)acrylate compound, a di(trimethylolpropane)caprolactone-modified tetra(meth)acrylate compound, a dipentaerythritol caprolactone-modified poly(meth)acrylate compound, etc., wherein specific examples of the dipentaerythritol caprolactone-modified poly(meth)acrylate compound may include a dipentaerythritol caprolactone-modified di(meth)acrylate compound, dipentaerythritol caprolactone-modified tri(meth)acrylate compound, a dipentaerythritol caprolactone-modified tetra(meth)acrylate compound, a dipentaerythritol caprolactone-modified penta(meth)acrylate compound, a dipentaerythritol caprolactone-modified hexa(meth)acrylate compound or the like.

Furthermore, the structure of the dipentaerythritol caprolactone-modified poly(meth)acrylate compound may be represented by the following formula (17):

2-ethylhexyl(meth)acrylate, ethyl diethylene glycol(meth)acrylate, t-octyl(meth)acrylamide, diacetone(meth)acrylamide, dimethylamino(meth)acrylate, dodecyl(meth)acrylate, dicyclopentenyloxyethyl(meth)acrylate, dicyclopentenyl (meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate, ethylene glycol di(meth)acrylate, dicyclopentenyldi(meth)acrylate, triethylene glycol di(meth)acrylate, tetraethylene glycol di(meth)acrylate, tri(2-hydroxyethyl)isocyanurate di(meth)acrylate, tri(2-hydroxyethyl)isocyanurate tri(meth)acrylate, caprolactone-modified tri(2-hydroxyethyl)isocyanurate tri(meth)acrylate, trimethylolpropyl tri(meth)acrylate, triethylene glycol di(meth)acrylate, neo-pentylene glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, ditrimethylolpropyl tetra(meth)acryl ate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, and phenolic polyglycidyl ether(meth)acrylate.

The compound (B-2-ii) containing functional group represented by formula (16) is preferably selected from the group consisting of trimethylolpropyl triacrylate, pentaerythritol triacrylate, pentaerythritol tetraacrylate, dipentaerythritol hexaacrylate, dipentaerythritol pentaacrylate,

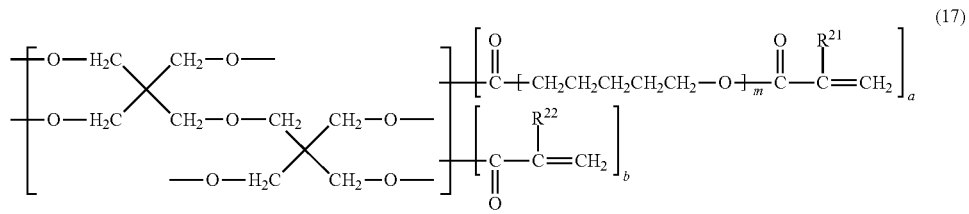

In formula (17), $R^{21}$ and $R^{22}$ respectively represent a hydrogen or a methyl group, p represents an integer ranging from 1 to 2, a represents an integer ranging from 1 to 6, b represents an integer ranging from 0 to 5, wherein a plus b may be equal to 2 to 6, preferably 3 to 6, more preferably 5 to 6, and optimally 6.

To be more specific, the (meth)acrylate compound (B-2-i) may be a product made by Nippon Kayaku Co., Ltd, for example, KAYARAD®DPCA-20, DPCA-30, DPCA-60, DPCA-120 (all product names) and so on.

Examples of the compound (B-2-ii) having the functional group represented by formula (16) include acrylamide, (meth)acryloylmorpholine, 7-amino-3,7-dimethyloctyl(meth)acrylate, iso-butoxymethyl(meth)acryl amide, iso-bornyloxyethyl(meth)acrylate, iso-bornyl(meth)acrylate, dipentaerythritol tetraacrylate, ditrimethylolpropyl tetraacrylate, TO-1382 manufactured by Toagosei Co, Ltd., and the composition thereof.

When the compound containing ethylenic unsaturated group (B) contained in the photosensitive resin composition of the invention includes at least one compound (B-1) selected from the group consisting of the compounds represented by formulas (8) and (9), the developability is better.

Based on 100 parts by weight of the alkali-soluble resin, the usage amount of the at least one compound (B-1) selected from the group consisting of the compounds represented by formulas (8) and (9) ranges from 40 parts by weight to 400 parts by weight, preferably 80 parts by weight to 350 parts by weight, and more preferably 100 parts by weight to 300 parts by weight.

The photoinitiator (C) contained in the photosensitive resin composition of the invention includes at least one compound selected from the group consisting of an acetophenone compound, a biimidazole compound, and an acyl oxime compound.

Specific examples of the acetophenone compound include p-dimethylamino-acetophenone, α,α'-dimethoxyazoxy-acetophenone, 2,2'-dimethyl-2-phenyl-acetophenone, p-methoxy-acetophenone, 2-methyl-1-(4-methylthio phenyl)-2-morpholino-1-propanone, and 2-benzyl-2-N,N-dimethylamino-1-(4-morpholinophenyl)-1-butanone.

Specific examples of the biimidazole compound include 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methyl phenyl)-4,4',5,5'-tetraphenyl-biimidazole, 2,2'-bis(o-methoxyphenyl)-4,4',5,5-tetraphenyl-biimidazole, 2,2'-bis(o-ethylphenyl)-4,4',5,5'-tetraphenyl-biimidazole, 2,2'-bis(p-methoxyphenyl)-4,4',5,5-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, and 2,2'-bis(2,4-dichlorophenyl)-4,4',5,5'-tetraphenyl-biimidazole.

Specific examples of the acyl oxime compound include ethanone, 1-[9-ethyl-6-(2-methylbenzoyl)-9H-carbazole-3-yl]-, 1-(O-acetyl oxime) (e.g., CGI-242 manufactured by Ciba Specialty Chemicals whose structure is represented by formula (18)), 1-(4-phenyl-thio-phenyl)-octane-1,2-dion 2-oxime-O-benzoate (e.g., CGI-124 manufactured by Ciba Specialty Chemicals whose structure is represented by formula (19)), and ethanone, 1-[9-ethyl-6-(2-chloro-4-benzyl-thio-benzoyl)-9H-carbazole-3-yl]-, 1-(O-acety 1 oxime) (made by Asahi Denka Co., Ltd. whose structure is represented by formula (20)).

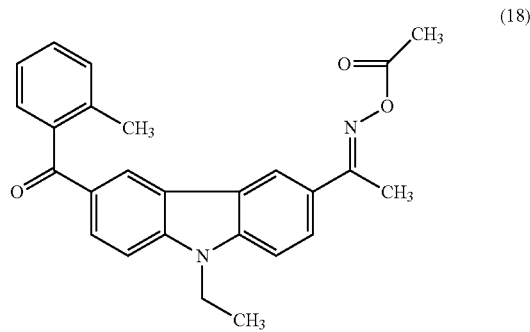

(18)

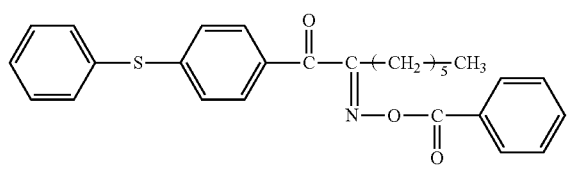

(19)

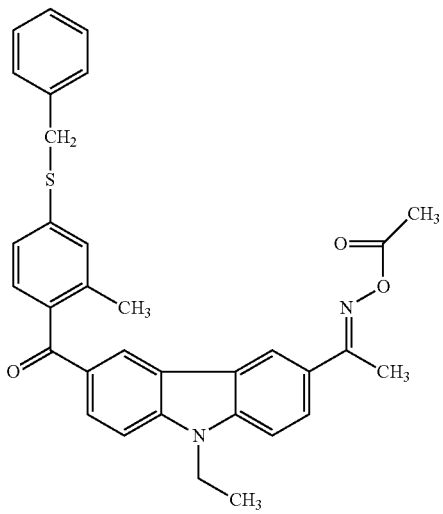

(20)

The photoinitiator (C) is preferably 2-methyl-1-(4-methylthio phenyl)-2-morpholino-1-propanone, 2-benzyl-2-N,N-dimethylamino-1-(4-morpholinophenyl)-1-butanone, 2,2,'-bis(o-chlorophenyl)-4,4',5,5'-tetraphenylbiimidazole, ethanone, 1-[9-ethyl-6-(2-methylbenzoyl)-9H-carbazole-3-yl]-, 1-(O-acetyloxime), or combinations thereof.

If needed, the following compounds may be added to photoinitiator (C): benzophenone compounds such as thioxanthone, 2,4-diethyl-thioxanthanone, thioxanthone-4-sulfone, benzophenone, 4,4'-bis(dimethylamino)benzophenone, 4,4'-bis(diethylamino)benzophenone, and the like; a-diketone compounds such as benzil, acetyl, and the like; acyloin compound such as benzoin and the like; acyloin ether compounds such as benzoin methylether, benzoin ethylether, benzoin isopropyl ether, and the like; acylphosphineoxide compounds such as 2,4,6-trimethyl-benzoyl-diphenyl-phosphineoxide, bis-(2,6-dimethoxy-benzoyl)-2,4,4-trimethyl-benzyl-phosphineoxide, and the like; quinone compounds such as anthraquinone, 1,4-naphthoquinone, and the like; halide compounds such as phenacyl chloride, tribromomethyl-phenylsulfone, tris(trichloromethyl)-s-triazine, and the like; and peroxide compounds such as di-tert-butyl peroxide and the like. Among them, the benzophenone compounds are preferred, and 4,4'-bis(diethylamino)benzophenone are more preferred.

The organic solvent (D) contained in the photosensitive resin composition of the invention is required to dissolve the alkali-soluble resin (A), the compound containing ethylenic unsaturated group (B), and the photoinitiator (C), and do not react with these components and has appropriate volatility.

Examples of the organic solvent (D) may include (poly)alkylene glycol monoalkyl ether compounds such as ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and the like; (poly)alkylene glycol monoalkyl ether acetate compounds such as ethylene glycol monomethyl ether acetate, ethylene glycol monoethyl ether acetate, propylene glycol monomethyl ether acetate, propylene glycol monoethyl ether acetate, and the like; other ether compounds such as diethylene glycol dimethyl ether, diethylene glycol methyl ethyl ether, diethylene glycol diethyl ether, tetrahydrofuran, and the like; ketone compounds such as methyl ethyl ketone, cyclohexanone, 2-heptanone, 3-heptanone, and the like; alkyl lactate compounds such as methyl 2-hydroxypropionate, ethyl 2-hydroxypropionate, and the like; other ester compounds such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate (EEP), ethyl ethoxyacetate, ethyl hydroxyacetate, methyl 2-hydroxy-3-methylbutyrate, 3-methyl-3-methoxybutyl acetate, 3-methyl-3-methoxybutylpropionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, ethyl 2-oxybutyrate, and the like; aromatic hydrocarbon compounds such as toluene, xylene, and the like; and carboxylic amide compounds such as N-methylpyrrolidone, N,N-dimethylformamide, N,N-dimethylacetamide, and the like. Preferably, the organic solvent (D) is selected from propylene glycol monomethyl ether acetate or ethyl 3-ethoxypropionate, and the aforementioned solvent may be used alone or in a combination of a plurality of the aforementioned compounds.

In the photosensitive resin composition of the invention, based on 100 parts by weight of the alkali-soluble resin (A), the usage amount of the compound containing ethylenic unsaturated group (B) is from 50 to 500 parts by weight, preferably from 80 to 450 parts by weight, and more preferably from 100 to 400 parts by weight, the usage amount of the photoinitiator (C) is from 10 to 150 parts by weight, preferably from 20 to 130 parts by weight, and more preferably from 30 to 100 parts by weight, the usage amount of the organic solvent (D) is from 500 to 5,000 parts by weight, preferably from 800 to 4,500 parts by weight, and more preferably from 1,000 to 4,000 parts by weight.

In an embodiment, the photosensitive resin composition of the invention may further include a secondary or tertiary aliphatic thiol compound (E). The secondary or tertiary aliphatic thiol compound (E) serves as a chain transfer agent and has an ability of hydrogen atom supply. The order here indicates the number of carbons bonded to a carbon adjacent to thiol group.

Examples of secondary or tertiary aliphatic thiol compound (E) may include t-butyl mercaptan, octyl-2-mercaptopropionate, octyl-3-mercaptobutyrate, stearyl-2-mercaptopropionate, stearyl-3-mercaptobutyrate, 2,5-hexanedithiol, 2,9-decanedithiol, 1,4-butanediol bis(2-mercaptopropionate), 1,4-butanediol bis(3-mercaptobutyrate), ethylene glycol bis(2-mercaptopropionate), ethylene glycol bis(3-mercaptobutyrate), trimethylolpropane tris(2-mercaptopropionate), trimethylolpropane tris(3-mercaptobutyrate), pentaerythritol tetrakis(2-mercaptopropionate), pentaerythritol tetrakis(3-mercaptobutyrate), dipentaerythritol pentakis(2-mercaptopropionate), dipentaerythritol pentakis(3-mercaptobutyrate), and the like.

The secondary or tertiary aliphatic thiol compound (E) is preferably t-butyl mercaptan, octyl-2-mercaptopropionate, octyl-3-mercaptobutyrate, stearyl-2-mercaptopropionate, stearyl-3-mercaptobutyrate, 2,5-hexanedithiol, 2,9-decanedithiol, 1,4-butanediol bis(2-mercaptopropionate), 1,4-butanediol bis(3-mercaptobutyrate), ethylene glycol bis(2-mercaptopropionate), ethylene glycol bis(3-mercaptobutyrate), etc.

In general, primary aliphatic thiol compounds have high volatility and stink an unpleasant odor. In contrast, the secondary or tertiary aliphatic thiol compounds have lower volatility and thus, do not have the issue of the unpleasant odor when serving as a component of the photosensitive composition, and therefore, a better photosensitive composition may be obtained. Furthermore, when the photosensitive resin composition of the invention includes the secondary or tertiary aliphatic thiol compound (E), the obtained contour angle is better.

Based on 100 parts by weight of the alkali-soluble resin (A), the usage amount of the secondary or tertiary aliphatic thiol compound (E) is from 0.1 to 10 parts by weight, preferably 0.5 to 8 parts by weight, and more preferably 1 to 5 parts by weight.

The photosensitive resin composition of the invention may also include a coloring agent (F). The coloring agent (F) is at least one compound selected from the group consisting of organic and inorganic pigments.

The inorganic pigments include metallic compounds such as metal oxides, metallic complex salt, and the like, of which examples may include the metal oxides such as oxides of iron, cobalt, aluminium, cadmium, lead, copper, titanium, magnesium, chromium, zinc, antimony or the like, and composite oxides of the aforementioned metals.

Examples of the organic pigments may include C. I. Pigment Yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C. I. Pigment Orange 1, 5, 13, 14, 16, 17, 24, 34, 36, 38, 40, 43, 46, 49, 51, 61, 63, 64, 71, 73; C. I. Pigment Red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C. I. Pigment Violet 1, 19, 23, 29, 32, 36, 38, 39; C. I. Pigment Blue 1, 2, 15, 15:3, 15:4, 15:6, 16, 22, 60, 66; C. I. Pigment Green 7, 36, 37; C. I. Pigment Brown 23, 25, 28; C. I. Pigment Black 1, 7, etc.

Based on 100 parts by weight of the alkali-soluble resin (A), the usage amount of the coloring agent (F) is from 20 to 200 parts by weight, preferably 30 to 180 parts by weight, and more preferably 40 to 150 parts by weight.

The photosensitive resin composition of the invention may also contain an additive (G). The examples of additive (G) include surfactant, filler, a polymer compound in which the alkali-soluble resin (A) is except, adhesion promoting agent, antioxidant, ultraviolet absorber, anti-coagulant, and the like.

The surfactant is helpful in improving the coating property of the photosensitive resin composition of the invention, and examples thereof may include polyethylene oxide alkyl ethers such as polyethylene oxide lauryl ether, polyethylene oxide stearyl ether, polyethylene oxide oleyl ether, and the like, polyethylene oxide alkyl phenyl ethers such as polyethylene oxide octyl phenyl ether, polyethylene oxide nonyl phenyl ether, and the like, polyethylene glycol dialkyl esters such as polyethylene glycol dilaurate, polyethylene glycol distearate, and the like, sorbitan fatty acid esters, fatty acid modified polyesters, tertiary amine modified polyurethanes and KP products made by Shin-Etsu Chemical Co., Ltd., SF-8427 products made by Toray Dow Corning Silicon, Polyflow products made by Kyoei-Sha Yushi Kagaku Kogyo Co., Ltd., F-Top products made by Tochem Products Co., Ltd., Megafac products made by Dainippon Ink & Chemicals, Inc., Fluorade products made by Sumitomo 3M Co., Ltd., and Asahi Guard products and Surflon products made by Asahi Glass Co., Ltd.

Examples of the filler may include glass, aluminum, and the like. Examples of the polymer compound may include polyvinyl alcohol, polyethylene glycol monoalkyl ether, polyfluoro alkyl acrylate, and the like. Examples of the adhesion promoting agent may include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxy propylthmethoxysilane, 3-glycidyloxy propylmethyldimethoxysilane, 2-(3,4-epoxycyclohexyl)ethyltrimethoxysilane, 3-chloropropylmethyl dimethoxysilane, 3-chloropropyltrimethoxysilane, 3-methacryloyloxypropyltrimethoxysilane, 3-mercaptopropyltrimethoxysilane, and the like. Examples of the antioxidant may include 2,2-thiobis(4-methyl-6-t-butylphenol), 2,6-di-t-butylphenol, and the like. Examples of the ultraviolet absorber may include 2-(3-t-butyl-5-methyl-2-hydroxyphenyl)-5-chlorophenylazide, alkoxyphenone, and the like. Examples of the anti-coagulant may include sodium polyacrylate and the like.

Based on 100 parts by weight of the alkali-soluble resin (A), the usage amount of the additive (G) is from 0.1 to 10 parts by weight, preferably 0.5 to 8 parts by weight, and more preferably 1 to 6 parts by weight.

The invention also provides a method of manufacturing a color filter, which will be described in detail below.

<Preparation of Photosensitive Resin Composition>

The alkali-soluble resin (A), the compound containing ethylenic unsaturated group (B), the photoinitiator (C) and the organic solvent (D) are stirred in an agitator so that the mixture is uniformly mixed into a solution state, and if needed, the secondary or tertiary aliphatic thiol compound (E), the coloring agent (F), or the additive (G) may be added. After the aforementioned components are uniformly mixed, the photosensitive resin composition in the solution state can be obtained.

The invention is not intent to limit the method of preparing the transparent photosensitive resin composition, and for example, a part of the alkali-soluble resin (A) and a part of the compound containing ethylenic unsaturated group (B) may be dispersed in a part of a medium of the organic solvent (D) to form a dispersion liquid first, and thereafter, the rest of the alkali-soluble resin (A), the rest of the compound containing ethylenic unsaturated group (B), the photoinitiator (C), and the organic solvent (D) are mixed thereinto to obtain the photosensitive resin composition.

The invention is also not intent to limit the method of preparing the colored photosensitive resin composition. For example, the colored photosensitive resin composition can be prepared by directly adding and dispersing the coloring agent (F) into the photosensitive resin composition for a color filter, or alternatively, by first dispersing a part of the coloring agent (F) in a part of a medium containing the alkali-soluble resin (A) and the organic solvent (D) to form a colorant dispersion liquid and then mixing the rest of the alkali-soluble resin (A), the compound containing ethylenic unsaturated group (B), the photoinitiator (C), and the organic solvent (D) thereinto. The process of dispersing the coloring agent (F) may be performed by using a mixer such as a beads mill or a roll mill to mix the aforementioned components.

<The Formation of Pixel Colored Layer>

The photosensitive resin composition solution of the invention in the solution sate may be coated on a substrate by spin coating, cast coating, roll coating, or the like. Examples of the substrate may include a glass for a liquid crystal display such as alkali-free glass, soda-lime glass, Pyrex glass, quartz glass, those glass attached with a transparent conductive film, and the like; a substrate (e.g., a silicon substrate) for a photoelectric conversion device (e.g., a solid-state imaging device); a substrate on which a black matrix for shielding light capable of isolating the pixel colored layer such as red, green, and blue pixels is formed.

After the coating process, most of the organic solvent contained in the photosensitive resin composition solution is removed by a drying process under reduced pressure, and then the remaining organic solvent is completely removed by a pre-bake process to form a pre-baked coating film. During the process, the operating conditions of the drying process under reduced pressure and pre-bake process vary according to the kinds and the mixing ratio of each component. Generally, the drying process under reduced pressure is performed under a pressure of 0 mmHg to 200 mmHg for 1 to 60 seconds, and the pre-bake process is performed under a temperature ranging from 70° C. to 100° C. for 1 to 15 minutes.

After the pre-bake process, an exposure process is performed on the pre-baked coating film using a photomask with a predetermined pattern. The light used in the exposure process is preferably ultraviolet (UV) ray such as g-ray, h-ray, and i-ray, and examples of apparatuses for emitting the UV ray may include a (ultra-)high pressure mercury lamp and a metal halide lamp.

After the exposure process, the pre-baked coating film is immersed in a developing solution at a temperature of 23±2° C. for about 15 seconds to 5 minutes to remove the unnecessary part of the pre-baked coating film so as to form a predetermined pattern on the substrate. The developing solution may be an aqueous alkali solution containing alkali compounds such as sodium hydroxide, potassium hydroxide, sodium carbonate, sodium bicarbonate, potassium carbonate, potassium bicarbonate, sodium silicate, sodium methylsilicate, aqueous ammonia, ethylamine, diethylamine, dimethylethanolamine, tetramethylammonium hydroxide, tetraethylammonium hydroxide, choline, pyrrole, piperidine, 1,8-diazabicyclo-[5,4,0]-7-undecene, and the like, which has a concentration of 0.001 to 10 wt %, preferably 0.005 to 5 wt %, and more preferably from 0.01 to 1 wt %.

Thereafter, the pattern on the substrate is washed using water, and then the pattern is dried using compressed air or nitrogen. Finally, the pattern is post-baked using a heating device such as a hot plate or an oven. The heating temperature is set at a temperature ranging from 150° C. to 250° C. The heating time when using the hot plate is 5 to 60 minutes and the heating time when using the oven is 15 to 150 minutes. Thereby, the pattern is fixed so that the pixel colored layer is formed. By repeating the aforementioned steps, pixel colored layers such as a red, a green, a blue pixel layer and so on may be formed in sequence on the substrate.

<The Formation of Protective Film>

In a method of forming a protective film of the invention, the aforementioned transparent photosensitive resin composition is coated on the substrate where pixel colored layers such as a red, a green, a blue pixel layer and so on are formed, and then a heating process such as a pre-bake process is performed to remove the solvents therein so that the protective film of a color filter layer is formed.

Examples of the aforementioned coating method includes spray coating method, roller coating method, spin coating method, bar coating method, ink jet coating method, etc. In the coating methods, coating process is performed preferably using a spin coater, a spin-less coating machine, a slit-die coating machine, etc.

Conditions of the aforementioned pre-bake process vary according to the kinds and the mixing ratio of each component. Generally, the pre-bake process is performed at a temperature from 70° C. to 90° C. for 1 to 15 minutes. After the pre-bake process, the pre-baked coating film has a thickness ranging from 0.15 μm to 8.5 μm, preferably 0.15 μm to 6.5 μm, and most preferably 0.15 μm to 4.5 μm. It should be understood that the thickness of the pre-baked coating film refers to the thickness after the solvent is removed.

After the pre-baked coating film is formed, a heating process is performed using a heating apparatus such as a hot plate or an oven. The heating process is commonly performed at a temperature from 150° C. to 250° C., wherein the heating time when using the hot plate is 5 to 30 minutes, and the heating time when using the oven is 30 to 90 minutes.

When the photoinitiator is used in the aforementioned curable resin composition, if needed, the curable resin composition may be coated on the surface of the substrate, the solvent is removed by the pre-bake process to form the pre-baked coating film, and then, the pre-baked coating film is exposed.

The light used in the exposure process may include visible light, UV ray, far-UV ray, electron beams, x-ray, etc., and UV ray with a wavelength ranging from 190 nm to 450 nm is preferred.

The exposure quantity of the exposure process is preferably 100 J/m$^2$ to 20,000 J/m$^2$, but more preferably 150 J/m$^2$ to 10,000 J/m$^2$.

After the aforementioned exposure process, a heating process may be selectively performed using a heating apparatus such as a hot plate or an oven. The temperature of the heating process is normally from 150° C. to 250° C., the heating time when using the hot plate is 5 to 30 minutes, and the heating time when using the oven is 30 to 90 minutes.

<The Formation of Color Filter>

After forming the pixel color layers such as a red, a green, a blue pixel layers and so on and the protective film, a sputtering process is performed on the surface of the protective film in a vacuum environment with a temperature of 220° C. to 250° C. to form an ITO protective film. If necessary, the ITO protective film may be etched and wired. Then, an alignment film is disposed on the surface of the ITO protective film. Thereby, a color filter containing a cured object by curing the photosensitive resin composition of the invention may be manufactured.

The invention further provides a liquid crystal display apparatus, and a manufacturing method thereof will be described below.

<Manufacture of Liquid Crystal Display Apparatus>

The aforementioned substrate with the color filter formed by the method of manufacturing the color filter and a driving substrate equipped with a thin film transistor (TFT) are arranged opposite to each other with a cell gap in between. The peripheral portions of the two substrates are adhered to each other using a sealing agent, and liquid crystals are filled into the cell gap defined by the surfaces of the substrates and the sealing agent, and the injection hole is sealed up to form a liquid crystal cell. Afterwards, affixing a polarizer to the exterior sides of the liquid crystal cell, i.e., the surfaces of each substrate that is opposite to the liquid crystal side to manufacture the liquid crystal display apparatus. The invention is not intent to limit the liquid crystals and the alignment film described herein, and any type of liquid crystals and alignment film that is commonly known in the art may be used.

Embodiments are provided as examples for illustration of the invention, but the invention is not limited to the contents disclosed in the provided embodiments.

PREPARATION EXAMPLES

Preparation of a Diol Compound with a Polymerizable Unsaturated Group (a-1)

Preparation Example (a-1-1)

100 parts by weight of fluorene epoxy compound (ESF-300 manufactured by Nippon Steel Chemical with an epoxy equivalent of 231), 30 parts by weight of acrylic acid, 0.3 parts by weight of benzyltriethylammonium chloride, 0.1 parts by weight of 2,6-di-tert-butyl-p-cresol, and 130 parts by weight of propylene glycol mono-methyl ether acetate are added continuously into a 500 mL 4-neck flask at a feed rate controlled in 25 parts by weight per minute. A temperature of the reaction process is maintained within a range from 100° C. to 110° C. for 15 hours so as to obtain a yellowish transparent mixture having 50 wt % of solid component content. After steps of extraction, filtration, heating, and drying, a diol compound with a polymerizable unsaturated group (a-1-1) having 99.9 wt % of solid component content can be obtained.

Preparation Example (a-1-2)

100 parts by weight of fluorene epoxy compound (PG-100 manufactured by Osaka Gas with an epoxy equivalent of 259), 35 parts by weight of methacrylic acid, 0.3 parts by weight of benzyltriethylammonium chloride, 0.1 parts by weight of 2,6-di-tert-butyl-p-cresol, and 135 parts by weight of propylene glycol mono-methyl ether acetate are added continuously into a 500 mL 4-neck flask at a feed rate controlled in 25 parts by weight per minute. A temperature of the reaction process is maintained within a range from 100° C. to 110° C. for 15 hours to obtain a yellowish transparent mixture having 50 wt % of solid component content. After steps of extraction, filtration, heating, and drying, a diol compound with a polymerizable unsaturated group (a-1-2) having 99.9 wt % of solid component content can be obtained.

Preparation Example (a-1-3)

100 parts by weight of fluorene epoxy compound (ESF-300 manufactured by Nippon Steel Chemical with an epoxy equivalent of 231), 100 parts by weight of 2-methacryloylethoxy succinate, 0.3 parts by weight of benzyltriethylammonium chloride, 0.1 parts by weight of 2,6-di-tert-butyl-p-cresol, and 200 parts by weight of propylene glycol mono-methyl ether acetate are added continuously into a 500 mL 4-neck flask at a feed rate controlled in 25 parts by weight per minute. A temperature of the reaction process is maintained within a range from 100° C. to 110° C. for 15 hours to obtain a yellowish transparent mixture having 50 wt % of solid component content. After steps of extraction, filtration, heating, and drying, a diol compound with a polymerizable unsaturated group (a-1-3) having 99.9 wt % of solid component content can be obtained.

Preparation Example (a-1-4)

0.3 mol of bis(4-hydroxyphenyl)sulfone, 9 mol of 3-chloro-1,2-epoxypropane, and 0.003 mol of tetramethyl ammonium chloride are added to a 1000 mL 3-neck flask equipped with a mechanical agitator, a thermometer, and a reflux condenser. The solution is stirred and heated to 105° C. to react for 9 hours. The unreacted 3-chloro-1,2-epoxypropane is distilled out under reduced pressure. The reaction system is cooled down to the room temperature, stirred and added with a 30 wt % aqueous solution formed by dissolving 9 mol of benzene and 0.5 mol of sodium hydroxide in the water, heated to 60° C. and maintained for 3 hours. The reaction solution is repeatedly washed using water until there is no presence of (tested by using AgNO$_3$). The solvent benzene is distilled out under reduced pressure, and then dried at 75° C. for 24 hours. Thereby, the epoxy compound of bis(4-hydroxyphenyl)sulfone can be obtained.

100 parts by weight of bis(4-hydroxyphenyl)sulfone epoxy compound (epoxy equivalent of 181), 30 parts by weight of acrylic acid, 0.3 parts by weight of benzyltriethylammonium chloride, 0.1 parts by weight of 2,6-di-tert-butyl-p-cresol, and 130 parts by weight of propylene glycol mono-methyl ether acetate are added continuously into a 500 mL 4-neck flask at a feed rate controlled in 25 parts by weight per minute. A temperature of the reaction process is maintained within a range from 100° C. to 110° C. for 15 hours to obtain a yellowish transparent mixture having 50 wt % of solid component content. After steps of extraction, filtration, heating, and drying, a diol compound with a polymerizable unsaturated group (a-1-4) having 99.9 wt % of solid component content can be obtained.

Preparation Example (a-1-5)

0.3 mol of bis(4-hydroxyphenyl)hexafluoropropane, 9 mol of 3-chloro-1,2-epoxypropane, and 0.003 mol of tetramethyl ammonium chloride are added to a 1000 mL 3-neck flask equipped with a mechanical agitator, a thermometer, and a reflux condenser. The solution is stirred and heated to 105° C. to react for 9 hours. The unreacted 3-chloro-1,2-epoxypropane is distilled out under reduced pressure. The reaction system is cooled down to the room temperature, stirred, added with a 30 wt % aqueous solution formed by dissolving 9 mol of benzene and 0.5 mol of sodium hydroxide in the water, heated to 60° C. and maintained for 3 hours. The reaction solution is repeatedly washed using water until there is no Cl$^-$ (tested by using AgNO$_3$). The solvent benzene is distilled out under reduced pressure, dried at 75° C. for 24 hours. Thereby, the epoxy compound of bis(4-hydroxyphenyl)hexafluoropropane can be obtained.

100 parts by weight of bis(4-hydroxyphenyl)hexafluoropropane epoxy compound (epoxy equivalent of 224), 35 parts by weight of methacrylic acid, 0.3 parts by weight of benzyltriethylammonium chloride, 0.1 parts by weight of 2,6-di-tert-butyl-p-cresol, and 135 parts by weight of propylene glycol mono-methyl ether acetate are added continuously into a 500 mL 4-neck flask at a feed rate controlled in 25 parts by weight per minute. A temperature of the reaction process is maintained within a range from 100° C. to 110° C. for 15 hours to obtain a yellowish transparent mixture having 50 wt % of solid component content. After steps of extraction, filtration, heating, and drying, a diol compound with a polymerizable unsaturated group (a-1-5) having 99.9 wt % of solid component content can be obtained.

Preparation Example (a-1-6)

0.3 mol of bis(4-hydroxyphenyl)dimethylsilane, 9 mol of 3-chloro-1,2-epoxypropane, and 0.003 mol of tetramethyl ammonium chloride are added to a 1000 mL 3-neck flask equipped with a mechanical agitator, a thermometer, and a reflux condenser. The solution is stirred and heated to 105° C. to react for 9 hours. The unreacted 3-chloro-1,2-epoxypropane is distilled out under reduced pressure. The reaction system is cooled down to the room temperature, stirred, added with a 30 wt % aqueous solution formed by dissolving 9 mol of benzene and 0.5 mol of sodium hydroxide in the water, heated to 60° C. and maintained for 3 hours. The reaction solution is washed using water until there is no Cl$^-$ (tested by using AgNO$_3$). The solvent benzene is distilled out under reduced pressure, dried at 75° C. for 24 hours. Thereby, the epoxy compound of bis(4-hydroxyphenyl)dimethylsilane can be obtained.

100 parts by weight of bis(4-hydroxyphenyl)dimethylsilane epoxy compound (epoxy equivalent of 278), 1.00 parts by weight of 2-methacryloylethoxy succinate, 0.3 parts by weight of benzyltriethylammonium chloride, 0.1 parts by weight of 2,6-di-tert-butyl-p-cresol, and 200 parts by weight of propylene glycol mono-methyl ether acetate are added continuously into a 500 mL 4-neck flask at a feed rate controlled in 25 parts by weight per minute. A temperature of the reaction process is maintained within a range from 100° C. to 110° C. for 15 hours to obtain a yellowish transparent mixture having 50 wt % of solid component content. After steps of extraction, filtration, heating, and drying, a diol compound with a polymerizable unsaturated group (a-1-6) having 99.9 wt % of solid component content can be obtained.

Preparation of Alkali-Soluble Resin (A)

Synthesis Example 1

1 mole of the diol compound with a polymerizable unsaturated group (a-1-1), 1.9 g of benzyltriethylammonium chloride, and 0.6 g of 2,6-di-tert-butyl-p-cresol are dissolved in 900 g of ethylene glycol monoethyl ether acetate, while 0.2 mole of 3,3',4,4'-biphenyltetracarboxylic dianhydride (a-2-1) and 1.6 mole of trimethoxysilylpropyl succinic anhydride (a-3-1) are added, heated to 110° C. and reacted for 2 hours (by simultaneously addition). Thereby, an alkali-soluble resin (A-1-1) with an acid value of 100 mgKOH/g and a number average molecular weight of 1566 can be obtained.

Synthesis Example 2

1 mole of the diol compound with a polymerizable unsaturated group (a-1-2), 2.0 g of benzyltriethylammonium chloridem, and 0.7 g of 2,6-di-tert-butyl-p-cresol are dissolved in 900 g of ethylene glycol monoethyl ether acetate, added with 0.3 mole of 3,3',4,4'-benzophenone tetracarboxylic dianhydride (a-2-2), reacted at a temperature of 90° C. for 2 hours. Subsequently, added with 1.4 mole of triethoxysilylpropyl succinic anhydride (a-3-2) and reacted at a temperature of 90° C. for 4 hours (by successively addition). Thereby, an alkali-soluble resin (A-1-2) with an acid value of 90 mgKOH/g and a number average molecular weight of 1981 can be obtained.

Comparative Synthesis Example 1

1 mole of the diol compound with a polymerizable unsaturated group (a-1-1), 1.9 g of benzyltriethylammonium chloride, and 0.6 g of 2,6-di-tert-butyl-p-cresol are dissolved in 700 g of ethylene glycol monoethyl ether acetate, while 0.3 mole of 3,3',4,4'-biphenyltetracarboxylic dianhydride (a-2-1) and 1.4 mole of butanedioic anhydride (a-4-1) are added, heated to 110° C. and reacted for 2 hours. Thereby, an alkali-soluble resin (A-2-1) with an acid value of 130 mgKOH/g and a number average molecular weight of 1888 can be obtained.

Synthesis Examples 3-10 and Comparative Synthesis Example 2-3

Beside the conditions indicated in Table 1 and Table 2, the alkali-soluble resins (A-1-3) through (A-1-10), (A-2-2), and (A-2-3) can be synthesized using the same methods described in Synthesize Examples 1, 2 and Comparative Synthesize Example 1.

Comparative Synthesis Example 4

A reactant (ASF-400 made by Nippon Steel Chemical with a solid component concentration of 50 wt %, acid value (converted in the solid content) of 1.28 mgKOH/g, and epoxy equivalent of 21300), in which bisphenol fluorene epoxy resin and acrylic acid have equal equivalents, dissolved in 198.53 g of 50% propylene glycol monomethyl ether acetate solution, 24.15 g of benzophenone tetracarboxylic dianhydride, 8.13 g of butanedioic anhydride, 48.12 g of propylene glycol monomethyl ether acetate, and 0.45 g of triphenylphosphine are added to a 500 mL 4-neck flask equipped with a reflux cooler, heated and stirred at a temperature of 120° C. to 150° C. for 1 hour and further heated and stirred in a temperature of 75° C. to 80° C. for 6 hours, added with 7.14 g of 3-epoxy propoxypropyl trimethoxysilane and then, stirred at 80° C. for 8 hours. Thereby, the alkali-soluble resin (A-2-4) can be synthesized. The obtained solid component of the resin solution is 53.2 wt %, acid value (converted in the solid content) is 110 mgKOH/g, and an area percentage of the alkali-soluble resin (A-2-4) in the resin solution analyzed by GPC is 91%, a number average molecular weight is 6621.

The following are description referring to the codes in Table 1 and Table 2:

| Code | Corresponding Compound |
|---|---|
| a-2-1 | 3,3',4,4'-biphenyltetracarboxylic dianhydride |
| a-2-2 | 3,3',4,4'-benzophenone tetracarboxylic dianhydride |
| a-2-3 | 3,3',4,4'-oxydiphenyltetracarboxylic dianhydride |
| a-3-1 | trimethoxysilylpropyl succinic anhydride |
| a-3-2 | triethoxysilylpropyl succinic anhydride |
| a-3-3 | methyldimethoxysilylpropyl succinic anhydride |
| a-3-4 | methyldiethoxysilylpropyl succinic anhydride |
| a-4-1 | butanedioic anhydride |
| a-4-2 | phthalic anhydride |
| PGMEA | propylene glycol monomethyl ether acetate |
| EEP | ethyl 3-ethoxypropionate |

TABLE 1

| | | Polymerization Component | | | | | | | | |
|---|---|---|---|---|---|---|---|---|---|---|
| | | Component (a-1) (mole) | | | | | | Component (a-2) (mole) | | |
| | Component | a-1-1 | a-1-2 | a-1-3 | a-1-4 | a-1-5 | a-1-6 | a-2-1 | a-2-2 | a-2-3 |
| Synthesize Example 1 | A-1-1 | 1.0 | | | | | | 0.2 | | |
| Synthesize Example 2 | A-1-2 | | 1.0 | | | | | | 0.3 | |
| Synthesize Example 3 | A-1-3 | | | 1.0 | | | | | | 0.4 |
| Synthesize Example 4 | A-1-4 | 1.0 | | | | | | 0.5 | | |
| Synthesize Example 5 | A-1-5 | | 1.0 | | | | | | 0.6 | |
| Synthesize Example 6 | A-1-6 | | 0.5 | 0.5 | | | | | | 0.7 |
| Synthesize Example 7 | A-1-7 | | | | 1.0 | | | 0.4 | 0.4 | |
| Synthesize Example 8 | A-1-8 | | | | | 1.0 | | | 1.0 | |
| Synthesize Example 9 | A-1-9 | | | | | | 1.0 | | | 0.15 |
| Synthesize Example 10 | A-1-10 | 1.0 | | | | | | 0.5 | | |

| | | Polymerization Component | | | | | |
|---|---|---|---|---|---|---|---|
| | | Component (a-3) (mole) | | | | Component (a-4) (mole) | |
| Component | | a-3-1 | a-3-2 | a-3-3 | a-3-4 | a-4-1 | a-4-2 |
| Synthesize Example 1 | A-1-1 | 1.6 | | | | | |
| Synthesize Example 2 | A-1-2 | | 1.4 | | | | |
| Synthesize Example 3 | A-1-3 | | | 1.2 | | | |
| Synthesize Example 4 | A-1-4 | | | 0.5 | 0.5 | | |
| Synthesize Example 5 | A-1-5 | | 0.5 | | | 0.3 | |
| Synthesize Example 6 | A-1-6 | | | 0.3 | | | 0.3 |

TABLE 1-continued

| | | | | | |
|---|---|---|---|---|---|
| Synthesize Example 7 | A-1-7 | 0.3 | | 0.1 | |
| Synthesize Example 8 | A-1-8 | | 0.02 | | |
| Synthesize Example 9 | A-1-9 | | | 1.5 | |
| Synthesize Example 10 | A-1-10 | | | | 0.01 |

| Component | | Monomer Input Method | Catalyst (g) benzyltri- ethyl- ammonium chloride | Polymeriza- tion inhibitor (g) 2,6-di-tert- butyl-p-cresol | solvent (g) PGMEA | EEP | (a-2)/(a-1) |
|---|---|---|---|---|---|---|---|
| Synthesize Example 1 | A-1-1 | Simulta- neously Addition | 1.9 | 0.6 | 900 | | 0.2 |
| Synthesize Example 2 | A-1-2 | Succes- sively Addition | 2.0 | 0.7 | 900 | | 0.3 |
| Synthesize Example 3 | A-1-3 | Simulta- neously Addition | 2.9 | 1.0 | 1000 | 100 | 0.4 |
| Synthesize Example 4 | A-1-4 | Succes- sively Addition | 1.9 | 0.6 | 800 | | 0.5 |
| Synthesize Example 5 | A-1-5 | Simulta- neously Addition | 2.0 | 0.7 | | 800 | 0.6 |
| Synthesize Example 6 | A-1-6 | Succes- sively Addition | 2.4 | 0.8 | 900 | | 0.7 |
| Synthesize Example 7 | A-1-7 | Simulta- neously Addition | 1.1 | 0.4 | 600 | | 0.8 |
| Synthesize Example 8 | A-1-8 | Succes- sively Addition | 1.3 | 0.4 | 600 | | 1.0 |
| Synthesize Example 9 | A-1-9 | Simulta- neously Addition | 1.1 | 0.4 | 600 | | 0.15 |
| Synthesize Example 10 | A-1-10 | Succes- sively Addition | 1.9 | 0.6 | 600 | | 0.5 |

| Component | | (a-3)/(a-1) | Reaction Temper- ature (° C.) | Reaction Time (Hour) | Acid Value (mgKOH/g) | Mn |
|---|---|---|---|---|---|---|
| Synthesize Example 1 | A-1-1 | 1.6 | 110 | 2 | 100 | 1566 |
| Synthesize Example 2 | A-1-2 | 1.4 | 90 | 2    4 | 90 | 1981 |
| Synthesize Example 3 | A-1-3 | 1.2 | 115 | 1.5 | 80 | 2412 |
| Synthesize Example 4 | A-1-4 | 1 | 95 | 1.5    4 | 110 | 2885 |
| Synthesize Example 5 | A-1-5 | 0.5 | 110 | 2 | 110 | 3050 |
| Synthesize Example 6 | A-1-6 | 0.3 | 90 | 2    3.5 | 90 | 3527 |
| Synthesize Example 7 | A-1-7 | 0.4 | 115 | 1.5 | 150 | 3964 |
| Synthesize Example 8 | A-1-8 | 0.02 | 95 | 2    3.5 | 140 | 4582 |
| Synthesize Example 9 | A-1-9 | 1.5 | 110 | 2 | 130 | 1395 |
| Synthesize Example 10 | A-1-10 | 0.01 | 90 | 2    4 | 70 | 3005 |

TABLE 2

| | | Polymerization Component | | | | | | | | |
|---|---|---|---|---|---|---|---|---|---|---|
| | | Component (a-1) (mole) | | | | | | Component (a-2) (mole) | | |
| Component | | a-1-1 | a-1-2 | a-1-3 | a-1-4 | a-1-5 | a-1-6 | a-2-1 | a-2-2 | a-2-3 |
| Comparative Synthesize Example 1 | A-2-1 | 1.0 | | | | | | 0.3 | | |
| Comparative Synthesize Example 2 | A-2-2 | | 1.0 | | | | | | 0.4 | |

TABLE 2-continued

| | | | | | | | |
|---|---|---|---|---|---|---|---|
| Comparative Synthesize Example 3 | A-2-3 | 1.0 | | | | | 0.5 |

| | | | Polymerization Component | | | | |
|---|---|---|---|---|---|---|---|
| | | | Component (a-3) (mole) | | | | Component (a-4) (mole) | |
| | Component | | a-3-1 | a-3-2 | a-3-3 | a-3-4 | a-4-1 | a-4-2 |
| Comparative Synthesize Example 1 | A-2-1 | | | | | | 1.4 | |
| Comparative Synthesize Example 2 | A-2-2 | | | | | | | 1.2 |
| Comparative Synthesize Example 3 | A-2-3 | | | | | | 1.0 | |

| | | Monomer Input Method | Catalyst (g) benzyltriethyl-ammonium chloride | Polymerization inhibitor (g) 2,6-di-tert-butyl-p-cresol | solvent (g) PGMEA | EEP | (a-2)/(a-1) |
|---|---|---|---|---|---|---|---|---|
| Comparative Synthesize Example 1 | A-2-1 | Simultaneously Addition | 1.9 | 0.6 | 700 | | 0.3 |
| Comparative Synthesize Example 2 | A-2-2 | Successively Addition | 2.0 | 0.7 | 800 | | 0.4 |
| Comparative Synthesize Example 3 | A-2-3 | Simultaneously Addition | 2.9 | 1.0 | 900 | | 0.5 |

| | Component | (a-3)/(a-1) | Reaction Temperature (° C.) | Reaction Time (Hour) | Acid Value (mgKOH/g) | Mn |
|---|---|---|---|---|---|---|
| Comparative Synthesize Example 1 | A-2-1 | — | 110 | 2 | 130 | 1888 |
| Comparative Synthesize Example 2 | A-2-2 | — | 90 | 2  4 | 120 | 2340 |
| Comparative Synthesize Example 3 | A-2-3 | — | 115 | 2 | 90 | 3210 |

Preparation of Photosensitive Resin Composition

Embodiment 1

100 parts by weight of alkali-soluble resin (A-1-1), 40 parts by weight of compound (hereinafter refer as B-1-1) shown in formula (10), 5 parts by weight of 2-methyl-1-(4-methylthio phenyl)-2-morpholino-1-propanone (hereinafter refer as C-1), 10 parts by weight of 2,2'-bis(2,4-dichlorophenyl)-4,4',5,5'-tetraphenyl-biimidazole (hereinafter refer as C-2), 5 parts by weight of 4,4'-bis(diethylamino)benzophenone (hereinafter refer as C-3), 0.1 parts by weight of 1,4-butanediol bis(3-mercaptobutyrate) (hereinafter refer as E-1), 20 parts by weight of pigment with mass ratio of C. I. Pigment Red 254/C. I. Pigment Yellow 139=80/20 (hereinafter refer as F-1), and 500 parts by weight of propylene glycol monomethyl ether acetate (hereinafter referred to as D-1) are mixed into a homogeneous solution state using a shaking type stirrer so as to synthesize the photosensitive resin composition of the invention. The obtained photosensitive resin composition is evaluated by the following evaluation methods, and obtained results shown in Table 3.

<Evaluation Method>

<Developability>

The photosensitive resin composition is coated on a 100 mm×100 mm glass substrate by spin coating, dried under reduced pressure of 100 mmHg for 30 seconds, and then pre-baked at a temperature of 80° C. for 3 minutes so that a pre-baked coating film with a thickness of 2.5 μm can be formed.

Subsequently, 2 ml of a 2 weight % potassium hydroxide aqueous solution is dropped onto the pre-baked coating film, and then the time t required for dissolving the pre-baked coating film, which is equivalent to the developing time, is measured and evaluated based on the following standards:

⊚: t≤15 seconds;

○: 15 seconds<t≤20 seconds;

Δ: 20 seconds≤t≤25 seconds;

X: 25 seconds<t.

<Linearity of High Precision Pattern>

The pre-baked coating film, which has already been evaluated for developability, is irradiated by an ultraviolet light with 300 J/cm$^2$ of light intensity made by Canon PLA-501F via a photomask with stripe pattern having 25 μm in width and 50 μm in pitch so as to expose the pre-baked coating film. Then the exposed film is immersed in a developing solution for 2 minutes at a temperature of 23° C. before being washed by pure water. Subsequently, it is being post-baked for 80 minutes at a temperature of 200° C. so that a photosensitive resin layer with 2.0 μm of film thickness can be formed on the glass substrate.

The stripe pattern formed by aforementioned method is observed and evaluated using an optical microscope. The evaluation standards are as the following:
⊚: Good linearity;
○: linearity is partially poor;
X: poor linearity.
<Contour Angle>
The cross-section of the glass substrate 200 with a photosensitive resin layer 100, which has already been evaluated for high precision pattern linearity, is observed using a scanning electron microscope (SEM). As shown in FIG. 1, the contour angle $\theta_1$ is defined as the angle formed by the surface of the glass substrate 200 and two sides of the photosensitive resin layer 100. The evaluation standards for contour angle θ are as the following:
⊚: $40°<\theta_1 \leq 60°$;
○: $20°<\theta_1 \leq 40°$;
Δ: $10°<\theta_1 \leq 20°$;
X: $\theta_1<10°$.

Embodiments 2 to 10 and Comparative Examples 1 to 5

Beside the conditions indicated in Table 3 and Table 4, the photosensitive resin composition is synthesized using the same method as described in Embodiment 1 and evaluated, and the evaluation results are shown in Table 3 and Table 4.

Comparative Example 6

100 parts by weight of alkali-soluble resin (A-2-4), 50 parts by weight of compound (hereinafter referred to as B-1-1) shown in formula (10), 5 parts by weight of 2-methyl-1-(4-methylthio phenyl)-2-morpholino-1-propanone (hereinafter referred to as C-1), 10 parts by weight of 2,2'-bis(2,4-dichlorophenyl)-4,4',5,5'-tetraphenyl-biimidazole (hereinafter referred to as C-2), 5 parts by weight of 4,4'-bis(diethylamino)benzophenone (hereinafter referred to as C-3), 0.1 parts by weight of 1,4-butanediol bis(3-mercaptobutyrate) (hereinafter referred to as E-1), 20 parts by weight of pigment with mass ratio of C. I. Pigment Red 254/C. I. Pigment Yellow 139=80/20 (hereinafter referred to as F-1), and 500 parts by weight of propylene glycol monomethyl ether acetate (hereinafter referred to as D-1) are mixed into a homogeneous solution state using a shaking type stirrer so as to synthesize the photosensitive resin composition.

The evaluation results for Comparative Example 6 are as the following:

Developability: X

High Precision Pattern Linearity: X

Contour Angle: X

The following are the code references for Table 3 and Table 4:

| Code | Corresponding Compound |
|---|---|
| B-1-1 | Compound shown in formula (10) |
| B-1-2 | Compound shown in formula (13) |
| B-1-3 | Miramer M4004 (manufactures by Nippon Toyo Chemical Co., Ltd.) |
| B-1-4 | EM2421 (manufactured by Eternal Chemical Co., Ltd.) |
| B-2-1 | TO-1382 (manufactured by Nippon Toagosei Co, Ltd.) |
| B-2-2 | KAYARAD DPCA-20 (manufacture by Nippon Kayaku Co., Ltd.) |
| B-2-3 | dipentaerythritol hexaacrylate |
| C-1 | 2-methyl-1-(4-methylthio phenyl)-2-morpholino-1-propanone |
| C-2 | 2,2'-bis(2,4-dichlorophenyl)-4,4',5,5'-tetraphenyl-biimidazole |
| C-3 | 4,4'-bis(diethylamino)benzophenone |
| C-4 | 1-[4-(Phenylthio)phenyl]-octane-1,2-dione 2-(O-benzoyloxime) |
| D-1 | propylene glycol monomethyl ether acetate |
| D-2 | ethyl 3-ethoxypropionate |
| E-1 | 1,4-butanediol bis(3-mercaptobutyrate) |
| E-2 | ethylene glycol bis(2-mercaptopropionate) |
| E-3 | ethylene glycol bis(3-mercaptobutyrate) |
| F-1 | C.I.Pigment R254/C.I.Pigment Y139 = 80/20 |
| F-2 | C.I.Pigment G36/C.I.Pigment Y150 = 60/40 |
| F-3 | C.I.Pigment B15:6 |
| F-4 | C.I.Pigment BK7 |
| G-1 | 2,2-thiobis(4-methyl-6-t-butylphenol) |
| G-2 | 2-(3-t-butyl-5-methyl-2-hydroxyphenyl)-5-chlorophenylazide |

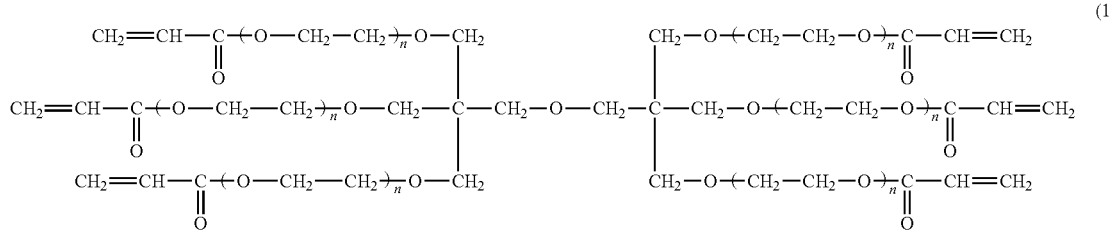

(10)

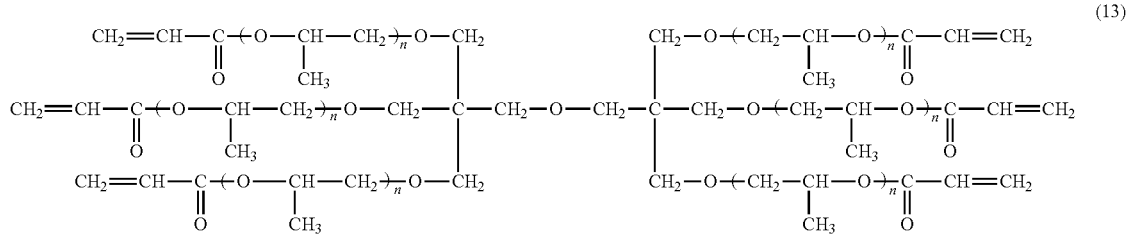

(13)

A sum of each n in formula (10) and formula (13) is 6.

TABLE 3

| Component | | | Embodiment 1 | 2 | 3 | 4 | 5 | 6 | 7 | 8 | 9 | 10 |
|---|---|---|---|---|---|---|---|---|---|---|---|---|
| Alkali-soluble resin (A) (parts by weight) | A-1 | A-1-1 | 100 | | | | | | | | | |
| | | A-1-2 | | 100 | | | | | | | | |
| | | A-1-3 | | | 100 | | | | | | | |
| | | A-1-4 | | | | 100 | 50 | | | | | |
| | | A-1-5 | | | | | 50 | | | | | |
| | | A-1-6 | | | | | | 70 | | | | |
| | | A-1-7 | | | | | | | 50 | | | |
| | | A-1-8 | | | | | | | | 30 | | |
| | | A-1-9 | | | | | | | | | 100 | |
| | | A-1-10 | | | | | | | | | | 100 |
| | A-2 | A-2-1 | | | | | | 30 | | | | |
| | | A-2-2 | | | | | | | 50 | | | |
| | | A-2-3 | | | | | | | | 70 | | |
| Compound containing ethylenic unsaturated group (B) (parts by weight) | B-1 | B-1-1 | 40 | | | | 200 | | | | | |
| | | B-1-2 | | 100 | | | | 150 | | | | |
| | | B-1-3 | | | 150 | 50 | | | | | | |
| | | B-1-4 | | 100 | | | | | 300 | | | 400 |
| | B-2 | B-2-1 | | | | | | 200 | | | 400 | |
| | | B-2-2 | | | | | 100 | | | 300 | | |
| | | B-2-3 | | | | | | | 200 | | | |
| Photoinitiator (C) (parts by weight) | C-1 | | 5 | 10 | | 20 | 20 | | 30 | 20 | 50 | 50 |
| | C-2 | | 10 | 20 | 30 | 30 | 30 | 5 | 30 | 30 | | 50 |
| | C-3 | | 5 | | | | | 25 | | 30 | | 50 |
| | C-4 | | | | | 20 | 30 | 50 | | 10 | | 50 |
| Organic solvent (D) (parts by weight) | D-1 | | 500 | | | 2500 | 4500 | 3000 | 2000 | 4000 | 2000 | 4000 |
| | D-2 | | | 2000 | | | | | 5000 | 1000 | 2000 | |
| Secondary or tertiary aliphatic thiol compound (E) (parts by weight) | E-1 | | 0.1 | | | | | | | | 10 | |
| | E-2 | | | | 1 | | | | | | | |
| | E-3 | | | | | | 5 | | | | | |
| Coloring agent (F) (parts by weight) | F-1 | | 20 | | | | 40 | | | | | |
| | F-2 | | | | 60 | | | 140 | | | | |
| | F-3 | | | | | 100 | | | | 120 | | |
| | F-4 | | | | | | 200 | | | 100 | | |
| Additive (G) | G-1 | | | | | | | | 0.1 | | | 10 |
| | G-2 | | | | 5 | | | | | | | |
| Evaluation Result | Developability | | ◎ | ◎ | ◎ | ◎ | ◎ | ○ | ◎ | ◎ | ○ | ◎ |
| | High Precision Pattern Linearity | | ◎ | ◎ | ◎ | ◎ | ◎ | ◎ | ◎ | ◎ | ◎ | ○ |
| | Contour Angle | | ◎ | ○ | ◎ | ○ | ◎ | ○ | ○ | ○ | ◎ | ○ |

TABLE 4

| Component | | | Comparative Examples 1 | 2 | 3 | 4 | 5 |
|---|---|---|---|---|---|---|---|
| Alkali-soluble resin (A) (parts by weight) | A-1 | A-1-1 | | | | | |
| | | A-1-2 | | | | | |
| | | A-1-3 | | | | | |
| | | A-1-4 | | | | | |
| | | A-1-5 | | | | | |
| | | A-1-6 | | | | | |
| | | A-1-7 | | | | | |
| | | A-1-8 | | | | | |
| | | A-1-9 | | | | | |
| | | A-1-10 | | | | | |
| | A-2 | A-2-1 | 100 | | | 100 | |
| | | A-2-2 | | 100 | | | 100 |
| | | A-2-3 | | | 100 | | |
| Compound containing ethylenic unsaturated group (B) (parts by weight) | B-1 | B-1-1 | 100 | | | | |
| | | B-1-2 | | 200 | | | |
| | | B-1-3 | | | 300 | | 200 |
| | | B-1-4 | | | | 400 | |
| | B-2 | B-2-1 | | | | | |
| | | B-2-2 | | | | | |
| | | B-2-3 | | | | | |
| Photoinitiator (C) (parts by weight) | C-1 | | | 20 | 20 | | 20 |
| | C-2 | | 30 | 30 | 30 | 5 | 30 |
| | C-3 | | | | | 25 | |
| | C-4 | | 20 | 30 | | 50 | 30 |
| Organic solvent (D) (parts by weight) | D-1 | | 2500 | 2500 | 2500 | | 2500 |
| | D-2 | | | | | 2500 | |
| Secondary or tertiary aliphatic thiol compound (E) (parts by weight) | E-1 | | | | | | |
| | E-2 | | | | | | |
| | E-3 | | | | | | |
| Coloring agent (F) (parts by weight) | F-1 | | 50 | | | | |
| | F-2 | | | 100 | | | |
| | F-3 | | | | 150 | | |
| | F-4 | | | | | 200 | |
| Additive (G) | G-1 | | | | | | |
| | G-2 | | | | | | |

TABLE 4-continued

|  |  | Comparative Examples | | | | |
|---|---|---|---|---|---|---|
| Component | | 1 | 2 | 3 | 4 | 5 |
| Evaluation Result | Developability | Δ | Δ | Δ | Δ | Δ |
| | High Precision Pattern Linearity | X | X | X | X | X |
| | Contour Angle | X | X | X | X | X |

Referring to Table 3 and Table 4, comparing the photosensitive resin composition containing the alkali-soluble resin (A-1) (Embodiments 1 through 10) with the photosensitive resin composition merely containing the alkali-soluble resin (A-2) (Comparative Examples 1 through 5), the photosensitive resin compositions containing the alkali-soluble resin (A-1) have better developability, better linearity of high precision pattern and contour angle.

Moreover, comparing the photosensitive resin composition containing the alkali-soluble resin (A-1) (Embodiments 1 through 10) with the Comparative Example 6, the photosensitive resin composition containing the alkali-soluble resin (A-1) also have better developability, better linearity of high precision pattern and contour angle.

In addition, referring to Table 3 and Table 4, comparing the photosensitive resin compositions containing the alkali-soluble resin in which the mole ratio (a-2)/(a-1) of the component (a-2) to the component (a-1) is within 0.2 to 1.0 (Embodiments 1 through 8) with the photosensitive resin composition containing the alkali-soluble resin in which the mole ratio (a-2)/(a-1) of the component (a-2) to the component (a-1) is 0.15 (Embodiment 9), the photosensitive resin compositions of Embodiments 1 through 8 have better developability.

Furthermore, as shown in Table 3 and Table 4, comparing the photosensitive resin compositions containing the alkali-soluble resin in which the mole ratio (a-3)/(a-1) of the component (a-3) to the component (a-1) is within 0.02 to 1.6 (Embodiments 1 through 9) with the photosensitive resin composition containing the alkali-soluble resin having the mole ratio (a-3)/(a-1) of the component (a-3) to the component (a-1) is 0.01 (Embodiment 10), the photosensitive resin compositions of Embodiments 1 through 9 have better linearity of high precision.

In summary, the photosensitive resin composition of the invention has excellent developability, linearity of high precision pattern, and contour angle since the photosensitive resin composition contains a specific alkali-soluble resin, and therefore the photosensitive resin composition of the invention is suitable for being applied to the color filter and the liquid crystal display apparatus.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. An alkali-soluble resin, represented by the following formula (1):

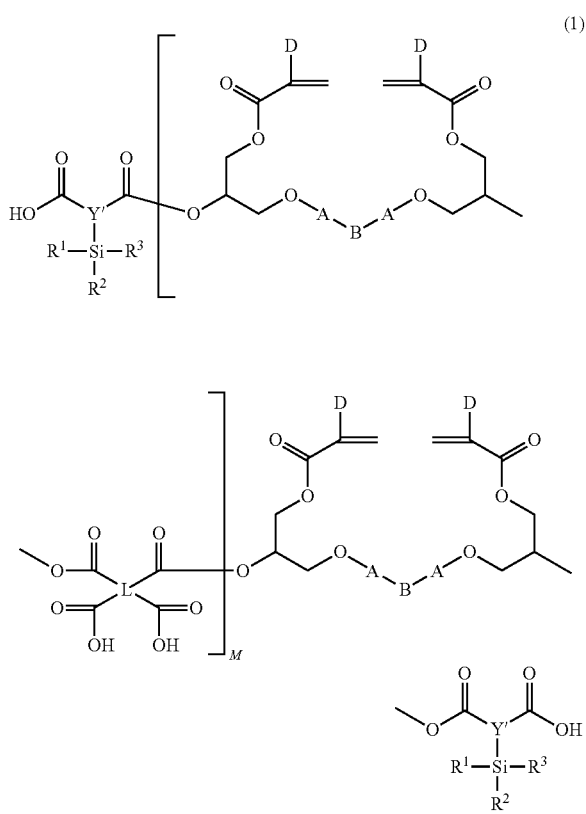

wherein in formula (1), A represents a phenylene group, and a hydrogen atom on the phenylene group may be substituted by a $C_1$-$C_5$ alkyl group, a halogen atom, or a phenyl group;

B represents —CO—, —$SO_2$—, —$C(CF_3)_2$—, —Si$(CH_3)_2$—, —$CH_2$—, —$C(CH_3)_2$—, —O—, 9,9-fluorenylene, or a single bond;

L represents a tetravalent carboxylic acid residue;

Y' represents a $C_1$-$C_{20}$ trivalent organic group;

each of $R^1$, $R^2$, and $R^3$ is independently a hydrogen atom, a halogen atom, or a monovalent organic group;

D represents a hydrogen atom or a methyl group; and

M is an integer ranging from 1 to 20.

2. The alkali-soluble resin according to claim 1, wherein the alkali-soluble resin is obtained by reacting at least a component (a-1), a component (a-2) and a component (a-3), the component (a-1) is a diol compound with a polymerizable unsaturated group, the component (a-2) is a tetracarboxylic acid or a tetracarboxylic dianhydride, and the component (a-3) is a dicarboxylic acid anhydride represented by the following formula (2),

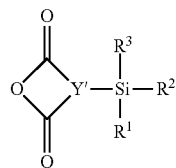

(2)

wherein in formula (2), Y' represents a $C_1$-$C_{20}$ trivalent organic group;

each of $R^1$, $R^2$, and $R^3$ is independently a hydrogen atom, a halogen atom, or a monovalent organic group.

3. The alkali-soluble resin according to claim 2, wherein a mole ratio (a-2)/(a-1) of the component (a-2) to the component (a-1) is 0.2 to 1.0.

4. The alkali-soluble resin according to claim 2, wherein a mole ratio (a-3)/(a-1) of the component (a-3) to the component (a-1) is 0.02 to 1.6.

5. A photosensitive resin composition, comprising:
an alkali-soluble resin represented by the following formula (1);
a compound containing ethylenic unsaturated group;
a photo-initiator; and
an organic solvent, (2)

wherein in formula (2), Y' represents a $C_1$-$C_{20}$ trivalent organic group;

each of $R^1$, $R^2$, and $R^3$ is independently a hydrogen atom, a halogen atom, or a monovalent organic group.

7. The photosensitive resin composition according to claim 6, wherein a mole ratio (a-2)/(a-1) of the component (a-2) to the component (a-1) is 0.2 to 1.0.

8. The photosensitive resin composition according to claim 6, wherein a mole ratio (a-3)/(a-1) of the component (a-3) to the component (a-1) is 0.02 to 1.6.

9. The photosensitive resin composition according to claim 5, wherein the compound containing ethylenic unsaturated group comprises at least one compound selected from the group consisting of compounds represented by formulas (8) and (9),

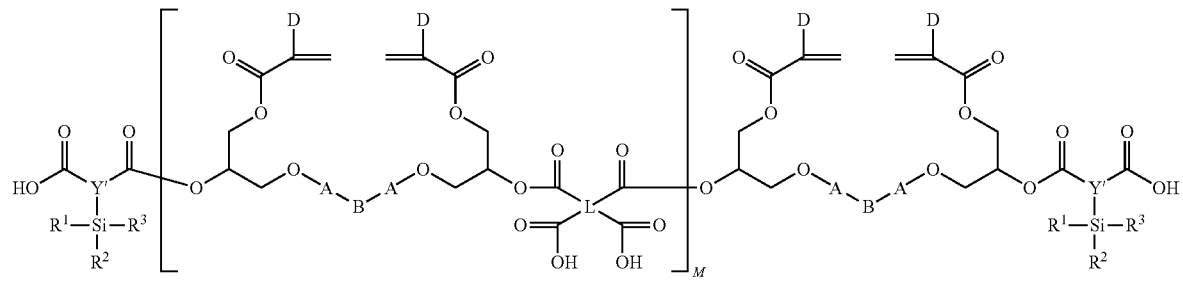

(1)

wherein in formula (1), A represents a phenylene group, and a hydrogen atom on the phenylene group may be substituted by a $C_1$-$C_5$ alkyl group, a halogen atom, or a phenyl group;

B represents —CO—, —SO$_2$—, —C(CF$_3$)$_2$—, —Si(CH$_3$)$_2$—, —CH$_2$—, —C(CH$_3$)$_2$—, —O—, 9,9-fluorenylene, or a single bond;

L represents a tetravalent carboxylic acid residue;

Y' represents a $C_1$-$C_{20}$ trivalent organic group;

each of $R^1$, $R^2$, and $R^3$ is independently a hydrogen atom, a halogen atom, or a monovalent organic group;

D represents a hydrogen atom or a methyl group; and

M is an integer ranging from 1 to 20.

6. The photosensitive resin composition according to claim 5, wherein the alkali-soluble resin is obtained by reacting at least a component (a-1), a component (a-2), and a component (a-3), the component (a-1) is a diol compound with a polymerizable unsaturated group, the component (a-2) is a tetracarboxylic acid or a tetracarboxylic dianhydride, and the component (a-3) is a dicarboxylic acid anhydride represented by following formula (2),

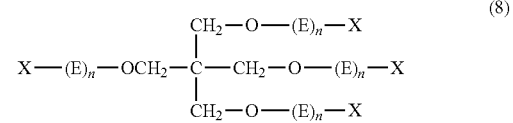

(8)

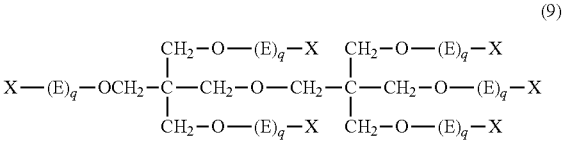

(9)

wherein in formula (8) and formula (9), each of E independently represents —((CH$_2$)$_y$CH$_2$O)— or —((CH$_2$)$_y$CH(CH$_3$)O)—, each of y independently represents an integer ranging from 1 to 10, and each of X independently represents an acryloyl group, a methacryloyl group, a hydrogen atom, or a carboxyl group;

wherein in formula (8), a total number of the acryloyl group and the methacryloyl group represented by X is 3 or 4, and each of n independently represents an integer ranging from 0 to 10, and a sum of each n is an integer ranging from 1 to 40; and wherein in formula (9), a total number of the acryloyl group and the methacryloyl group represented by X is 5 or 6, and each of q independently represents an integer ranging from 0 to 10, and a sum of each q is an integer ranging from 1 to 60.

10. The photosensitive resin composition according to claim 5, further comprising a secondary or tertiary aliphatic thiol compound.

11. The photosensitive resin composition according to claim 5, wherein based on 100 parts by weight of the alkali-soluble resin, an usage amount of the compound containing ethylenic unsaturated group is 50 to 500 parts by weight; an usage amount of the photoinitiator is 10 to 150 parts by weight; an usage amount of the organic solvent is 500 to 5000 parts by weight.

12. The photosensitive resin composition according to claim 5, further comprising a coloring agent.

13. The photosensitive resin composition according to claim 12, wherein based on 100 parts by weight of the alkali-soluble resin, an usage amount of the coloring agent is 20 to 200 parts by weight.

14. A method for manufacturing a color filter, comprising forming a pixel layer using the photosensitive resin compositions according to claim 5.

15. A color filter, manufactured by the method according to claim 14.

16. A liquid crystal display apparatus, comprising the color filter according to claim 15.

17. A method for manufacturing a color filter, comprising forming a protective film using the photosensitive resin compositions according to claim 5.

18. A color filter, manufactured by the method according to claim 17.

19. A liquid crystal display apparatus, comprising the color filter according to claim 18.

* * * * *